United States Patent
Lee et al.

(10) Patent No.: US 11,163,235 B2
(45) Date of Patent: Nov. 2, 2021

(54) APPARATUS FOR FORMING A PHOTORESIST LAYER, METHOD FOR FORMING A MASKING LAYER, AND METHOD FOR FORMING A PHOTORESIST LAYER

(71) Applicant: TAIWAN SEMICONDUCTOR MANUFACTURING COMPANY LTD., Hsinchu (TW)

(72) Inventors: Yung-Yao Lee, Hsinchu County (TW); Chen Yi Hsu, Hsinchu County (TW)

(73) Assignee: TAIWAN SEMICONDUCTOR MANUFACTURING COMPANY LTD., Hsinchu (TW)

(*) Notice: Subject to any disclaimer, the term of this patent is extended or adjusted under 35 U.S.C. 154(b) by 0 days.

(21) Appl. No.: 16/548,819

(22) Filed: Aug. 22, 2019

(65) Prior Publication Data
US 2021/0055658 A1    Feb. 25, 2021

(51) Int. Cl.
G03F 7/16    (2006.01)
G03F 7/004   (2006.01)
H01L 21/67   (2006.01)
H01L 21/02   (2006.01)
H01L 21/027  (2006.01)
G03F 7/30    (2006.01)
B05D 1/00    (2006.01)

(52) U.S. Cl.
CPC ............ *G03F 7/162* (2013.01); *G03F 7/004* (2013.01); *G03F 7/3028* (2013.01); *H01L 21/0273* (2013.01); *H01L 21/02282* (2013.01); *H01L 21/6715* (2013.01); *B05D 1/005* (2013.01)

(58) Field of Classification Search
CPC ........ G03F 7/162; G03F 7/004; G03F 7/3028; H01L 21/02282; H01L 21/0273; H01L 21/6715; B05D 1/005
USPC ........................................... 427/240
See application file for complete search history.

(56) References Cited

U.S. PATENT DOCUMENTS

| | | | |
|---|---|---|---|
| 6,207,357 B1 * | 3/2001 | Krauth | G03F 7/162 430/327 |
| 7,662,436 B1 * | 2/2010 | Wei | G03F 7/162 427/240 |
| 8,796,666 B1 | 8/2014 | Huang et al. | |
| 9,012,132 B2 | 4/2015 | Chang | |
| 9,093,530 B2 | 4/2015 | Huang et al. | |
| 9,028,915 B2 | 5/2015 | Chang et al. | |
| 9,146,469 B2 | 9/2015 | Liu et al. | |
| 9,213,234 B2 | 12/2015 | Chang | |
| 9,223,220 B2 | 12/2015 | Chang | |
| 9,256,133 B2 | 2/2016 | Chang | |
| 9,536,759 B2 | 1/2017 | Yang et al. | |
| 9,548,303 B2 | 1/2017 | Lee et al. | |

(Continued)

FOREIGN PATENT DOCUMENTS

WO    WO-2018116745 A1 *    6/2018    ............... B05C 5/02

*Primary Examiner* — Cachet I Proctor
(74) *Attorney, Agent, or Firm* — WPAT, P.C., Intellectual Property Attorneys; Anthony King

(57) ABSTRACT

The present disclosure provides a method for forming a masking layer, including spinning a wafer, dispensing a first liquid at a first location on the wafer, and dispensing a second liquid at a second location on the wafer simultaneously with dispensing the first liquid at the first location, wherein the second liquid is a remover of the first liquid, and the first location is different from the second location.

20 Claims, 24 Drawing Sheets

(56) References Cited

U.S. PATENT DOCUMENTS

| | | | | |
|---|---|---|---|---|
| 2001/0033895 | A1* | 10/2001 | Minami | G03F 7/162 427/240 |
| 2002/0176936 | A1* | 11/2002 | Matsuyama | B05C 11/08 427/240 |
| 2004/0265493 | A1* | 12/2004 | Mizuno | H01L 21/6715 427/335 |
| 2008/0057194 | A1* | 3/2008 | Tanaka | G03F 7/162 427/240 |
| 2011/0305995 | A1* | 12/2011 | Sato | G03F 7/168 430/324 |
| 2016/0167079 | A1* | 6/2016 | Hasimoto | H01L 21/6715 700/283 |
| 2018/0021804 | A1* | 1/2018 | Hashimoto | H01L 21/6715 427/425 |
| 2020/0147637 | A1* | 5/2020 | Inaba | B05D 3/12 |

* cited by examiner

Apparatus for forming a
photoresist layer, method for
forming a masking layer, and
method for forming a photoresist
layer

BACKGROUND

In the semiconductor industry, there is a trend toward higher device density. In order to achieve such higher density, smaller features are required. Such requirements frequently involve scaling down device geometries to achieve lower fabrication costs, higher device integration density, higher speeds, and better performance. Along with the advantages from geometry size reductions, improvements to semiconductor devices are being made.

The scaling down process entails high resolution photolithographic process. Photolithography process may include techniques pertinent to coating a masking layer (e.g. photoresist layer) on a wafer and partially removing a predetermined portion of the masking layer via developing.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
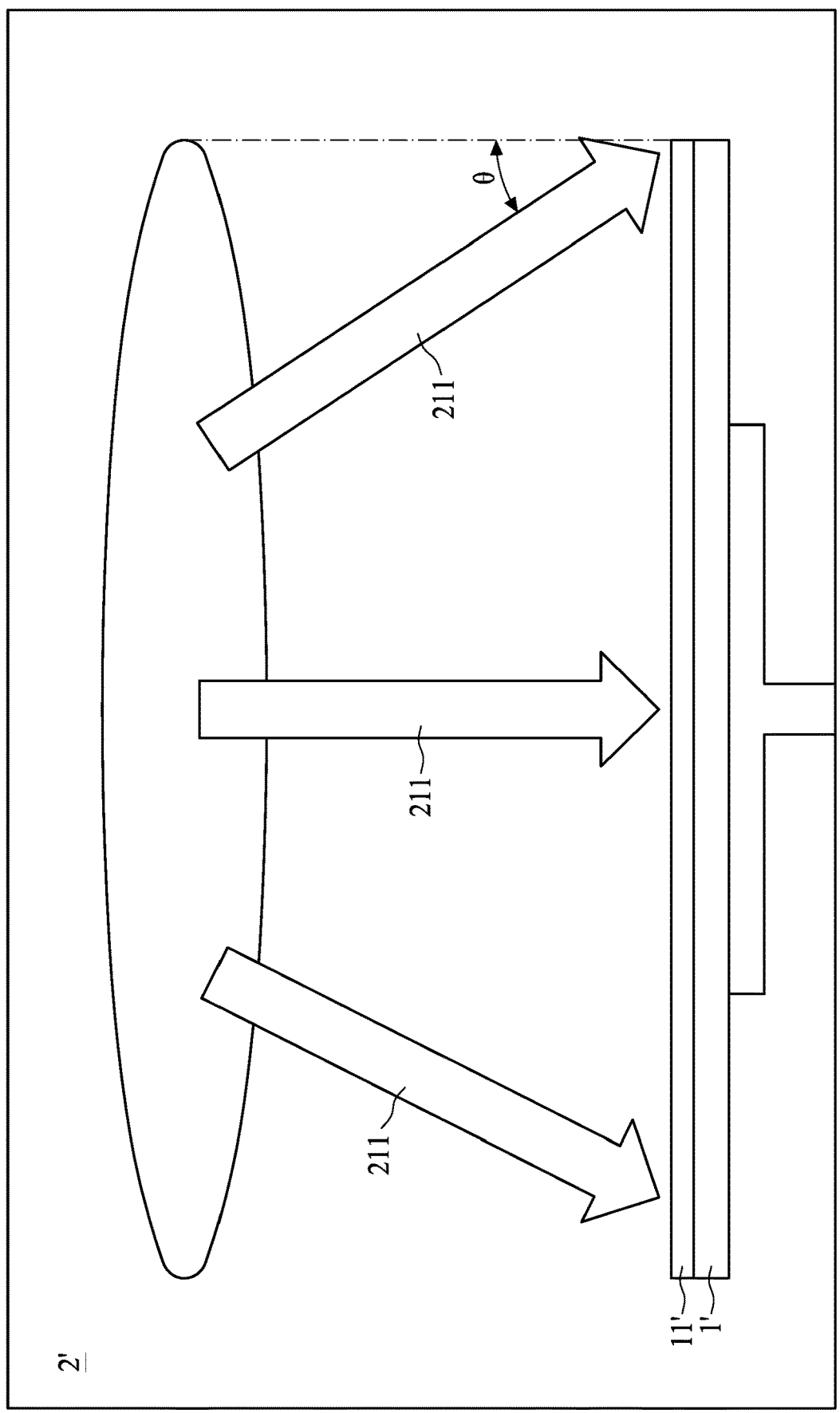
FIG. 1A is a schematic drawing illustrating an apparatus for performing an etching operation, in accordance with some comparative embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately," or "about" generally means within a value or range which can be contemplated by people having ordinary skill in the art. Alternatively, the terms "substantially," "approximately," or "about" means within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately," or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

Plasma etching is one of the methods for removing material from a surface of a wafer. Generally, plasma is ignited in a chamber in order to generate energized ions that are accelerated toward the wafer by an electric field. The ions physically and/or chemically remove a predetermined portion of material over the surface of the wafer. Etch uniformity indicates the capability of etching operations to evenly etch across the entire surface of the wafer. However, bulk plasma effect or local effects of the processing chamber such as chamber geometry, chamber size, or placement may induce non-uniformity.

Figure 1B:
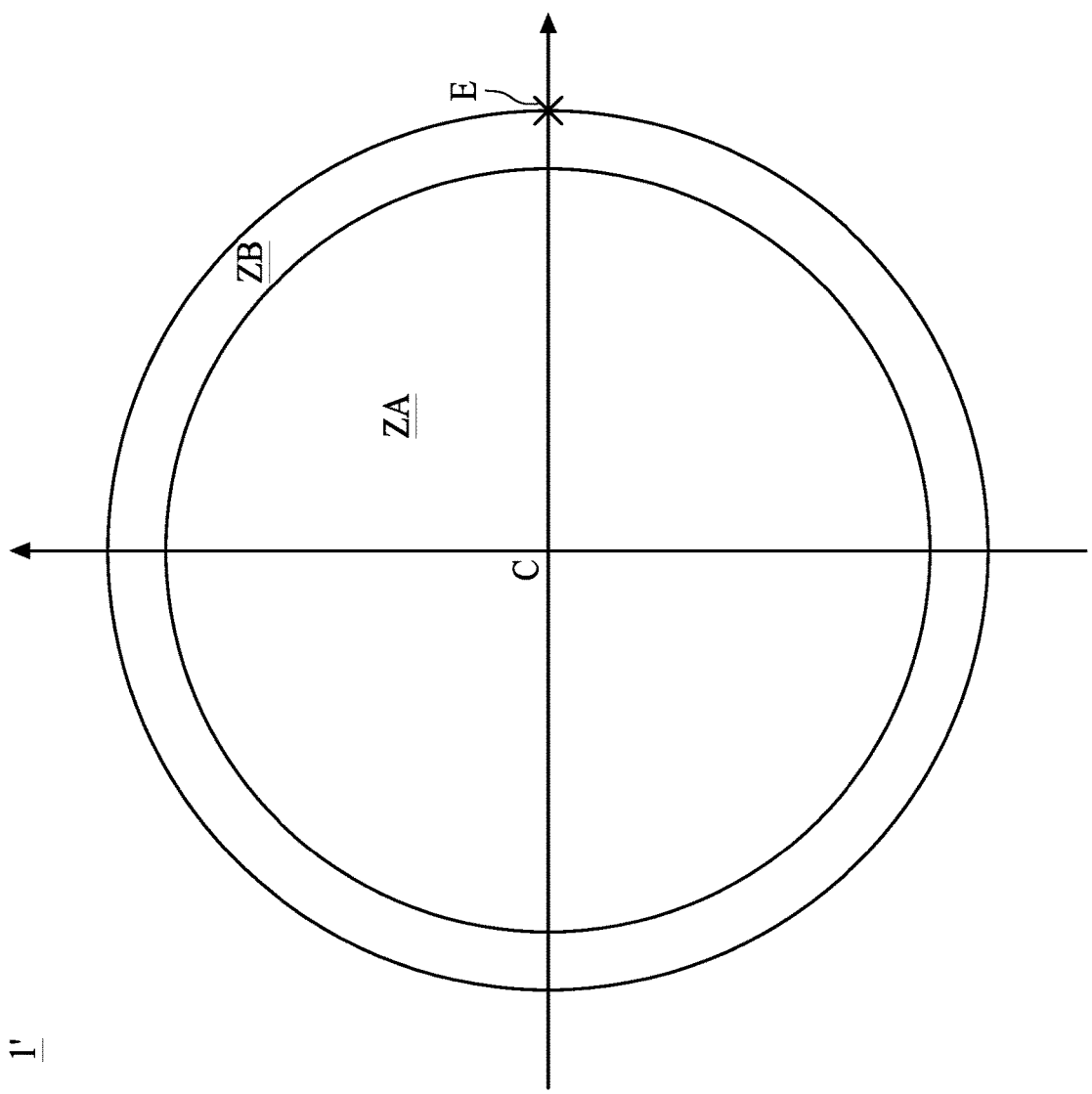
FIG. 1B shows a wafer from a top view perspective, in accordance with some comparative embodiments of the present disclosure.
Figure 1C:
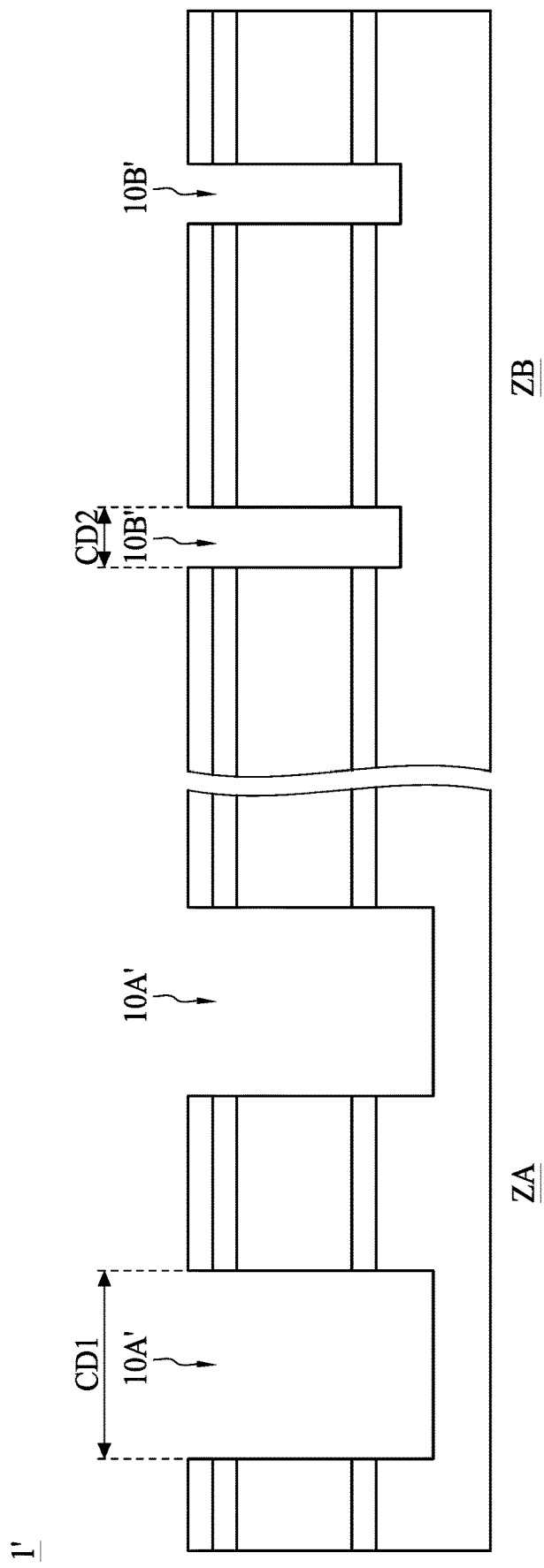
FIG. 1C is a schematic drawing illustrating a cross sectional view of a plurality of trenches formed in a wafer, in accordance with some comparative embodiments of the present disclosure.

Referring to FIG. 1A, FIG. 1B and FIG. 1C, FIG. 1A is a schematic drawing illustrating an apparatus for performing an etching operation. FIG. 1B shows the wafer in FIG. 1A from a top view perspective. FIG. 1C is a schematic drawing illustrating a cross sectional view of a plurality of trenches formed in the wafer of FIG. 1A, in accordance with some comparative embodiments of the present disclosure. An apparatus 2' is configured to perform a plasma etching operation on a wafer 1'. A masking layer 11' with substantially uniform thickness is formed on a top surface of the wafer 1', and a portion of material on the wafer 1' unprotected by the masking layer 11' is removed by ions 211 in plasma generated by the apparatus 2', and thereby a plurality of trenches 10A', 10B' are formed. However, due to the limitations of bulk plasma effect, which is associated with the plasma potential being higher at a center of the chamber projecting over a center of the underlying wafer 1' and lower at the side of the chamber projecting over an edge of the underlying wafer V. Alternatively stated, plasma sheath region can be found overlying the edge of the underlying wafer 1', and therefore, non-uniform etching can be observed between the center and the edge of the wafer V. Moreover, geometry and size of the apparatus 2' and an incident angle θ of ions 211 arrive at each position of the wafer 1' may be different and thereby causing the non-uniformity etching result across the wafer. For example, an incident angle of ions 211 at an edge portion E is greater than an incident angle of ions 211 at a center portion C.

It can be observed that a plasma etch rate at a certain local position is negatively correlated to an incident angle θ of ions 211 at such local position. Alternatively stated, a local plasma etch rate at an outer area ZB is less than a local plasma etch rate at an inner area ZA of the wafer 1. As a result, trenches 10B' formed in the outer area ZB has a critical dimension less than a critical dimension of trenches 10A' formed in the inner area ZA. Some trenches or patterns may be improperly formed due to such non-uniformity etch rate, thus yield may be deteriorated. Similar phenomena caused by non-uniform plasma etch rate may be observed in fin fabrication, semiconductor grating structure fabrication, or other semiconductor device fabrication operations.

The present disclosure provides a method for forming a masking layer and a method for forming a photoresist layer. The present disclosure also provides an apparatus for forming a photoresist layer or masking layer. By adjusting a thickness profile of a masking layer or a photoresist layer, the uniformity of the plasma etch in an inner region and outer region can be improved.

Figure 2A:
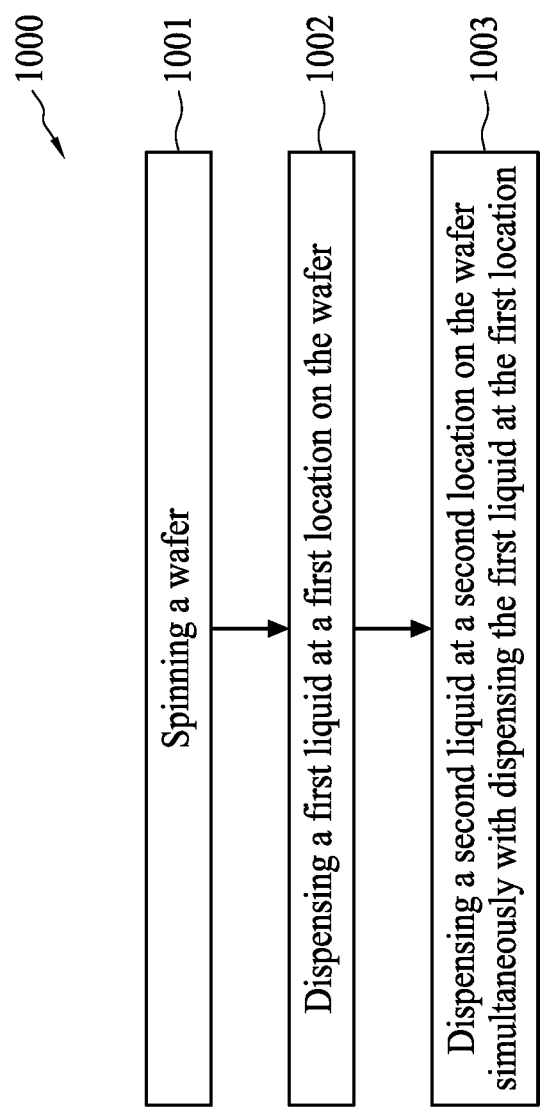
FIG. 2A shows a flow chart representing method for forming a masking layer, in accordance with some embodiments of the present disclosure.

Referring to FIG. 2A, FIG. 2A shows a flow chart representing a method for forming a masking layer, in accordance with some embodiments of the present disclosure. The method 1000 for forming a masking layer includes spinning a wafer (operation 1001, which can be referred to FIG. 5), dispensing a first liquid at a first location on the wafer (operation 1002, which can be referred to FIG. 5 to FIG. 7), and dispensing a second liquid at a second location on the wafer simultaneously with dispensing the first liquid at the first location (operation 1003, which can be referred to FIG. 4, FIG. 6, or FIG. 9A/FIG. 9B).

Figure 2B:
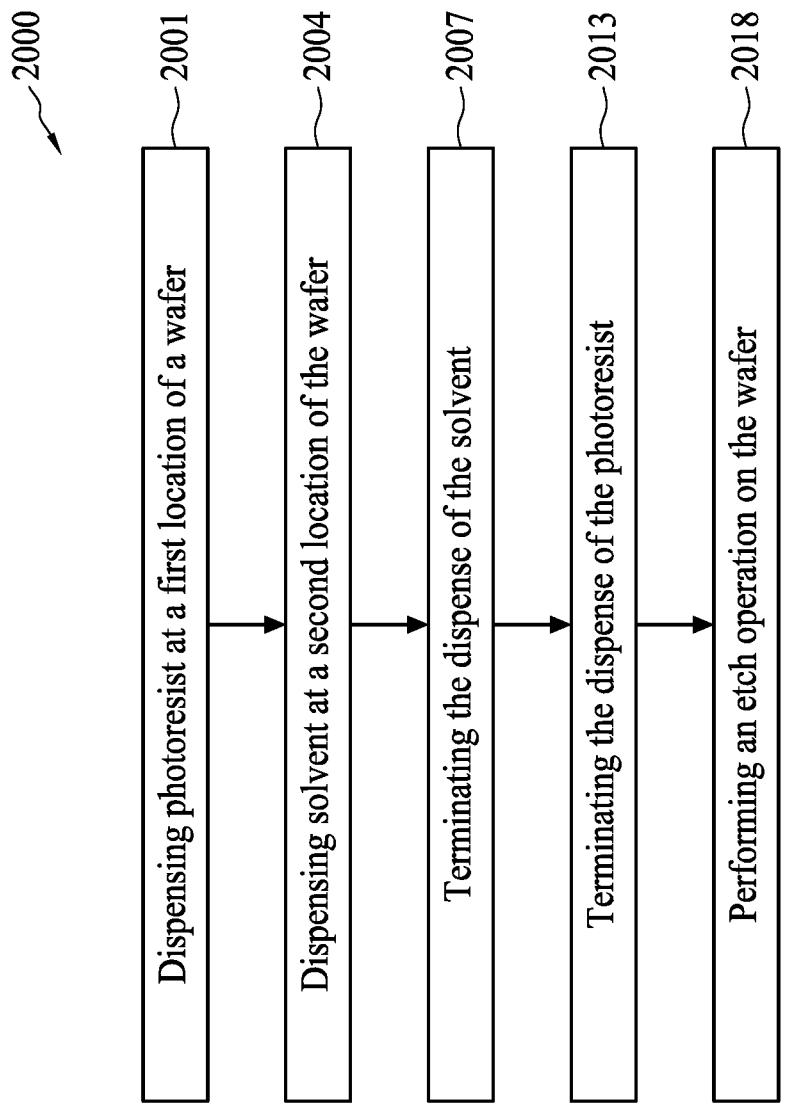
FIG. 2B shows a flow chart representing method for forming a photoresist layer, in accordance with some embodiments of the present disclosure.

Referring to FIG. 2B, FIG. 2B shows a flow chart representing method for forming a photoresist layer, in accordance with some embodiments of the present disclosure. The method 2000 for forming a photoresist layer includes dispensing photoresist at a first location of a wafer (operation 2001, which can be referred to FIG. 5 to FIG. 7), dispensing solvent at a second location of the wafer (operation 2004, which can be referred to FIG. 6, or FIG. 9A/FIG. 9B), terminating the dispense of the solvent (operation 2007, which can be referred to FIG. 4 and FIG. 7), terminating the dispense of the photoresist (operation 2013, which can be referred to FIG. 4 and FIG. 7), and performing an etch operation on the wafer (operation 2018, which can be referred to FIG. 11).

Figure 2C:
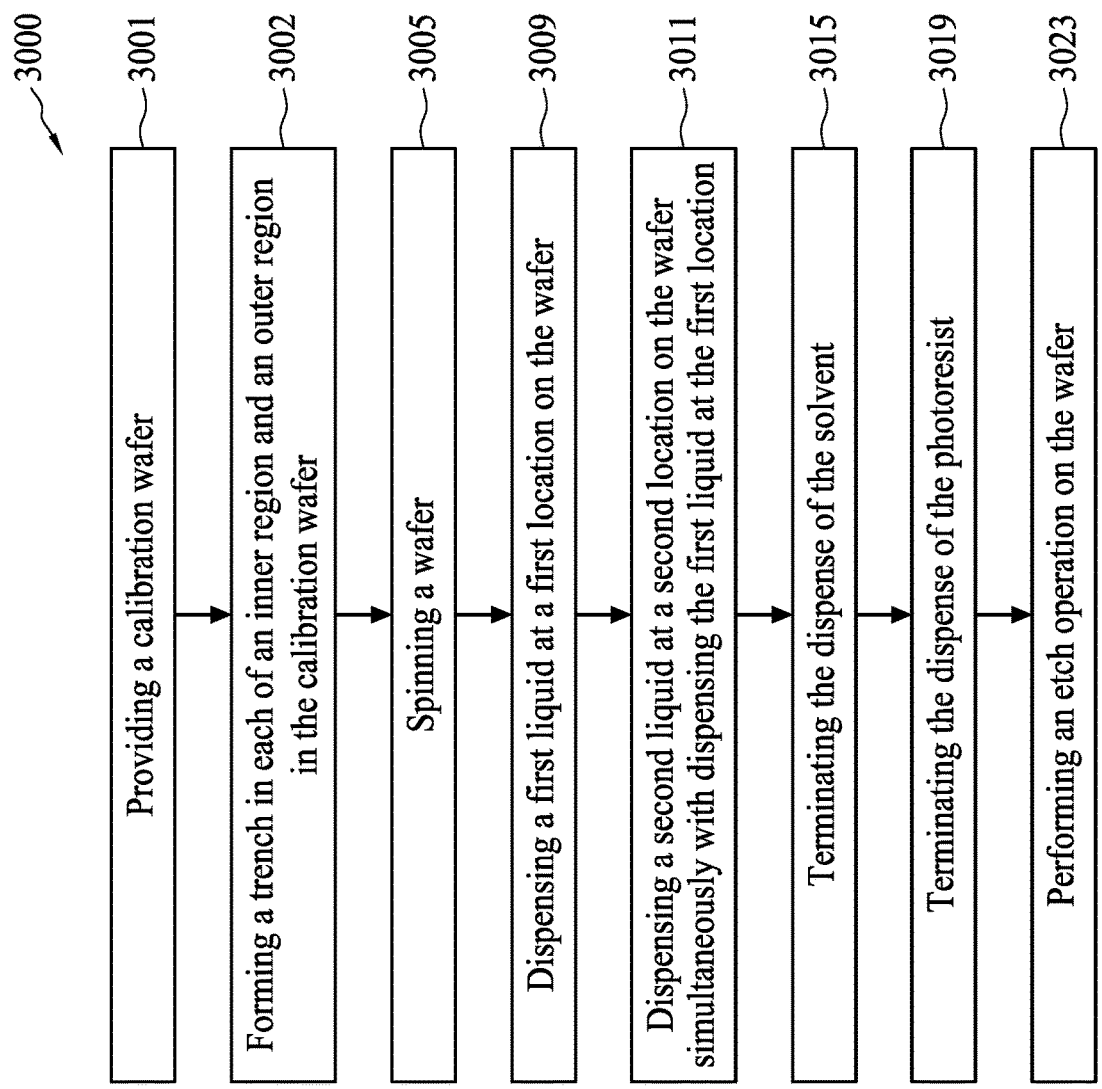
FIG. 2C shows a flow chart representing method for forming a masking layer, in accordance with some embodiments of the present disclosure.

Referring to FIG. 2C, FIG. 2C shows a flow chart representing method for forming a masking layer, in accordance with some embodiments of the present disclosure. The method 3000 for forming a masking layer includes spinning a wafer (operation 3005, which can be referred to FIG. 5), dispensing a first liquid at a first location on the wafer (operation 3009, which can be referred to FIG. 5 to FIG. 7), dispensing a second liquid at a second location on the wafer simultaneously with dispensing the first liquid at the first location (operation 3011, which can be referred to FIG. 6, or FIG. 9A/FIG. 9B), terminating the dispense of the solvent (operation 3015, which can be referred to FIG. 4 and FIG. 7), terminating the dispense of the photoresist (operation 3019, which can be referred to FIG. 4 and FIG. 7), and performing an etch operation on the wafer (operation 3023, which can be referred to FIG. 11).

In some embodiments, the method 3000 further includes conducting a calibration run on a calibration wafer (or a dummy wafer) prior to the operation 3005 applying on a wafer with devices fabricated thereon. The calibration run includes providing a calibration wafer (operation 3001, which can be referred to FIG. 3A) and forming a trench in each of an inner region and an outer region in the calibration wafer (operation 3002, which can be referred to FIG. 3B). In some embodiments, operations 3005, 3009, 3011, 3015, 3019, 3023 can be performed on the calibration wafer or the dummy wafer until several manufacturing parameters, including but not limited to, the dispensing conditions of the first liquid and the second liquid, the first location and the second location, the duration of dispensing the first liquid and the second liquid, are identified to achieve comparable critical dimension CD1 of trenches 10A" in the inner region Zi and the critical dimension CD2 of trenches 10B" (will be subsequently shown in FIG. 3B). After the aforesaid parameters are identified during calibration run, the parameters can be applied on the wafer with devices fabricated thereon, thereby reducing the manufacturing cost and increase critical dimension uniformity across entire wafer.

Figure 3A:
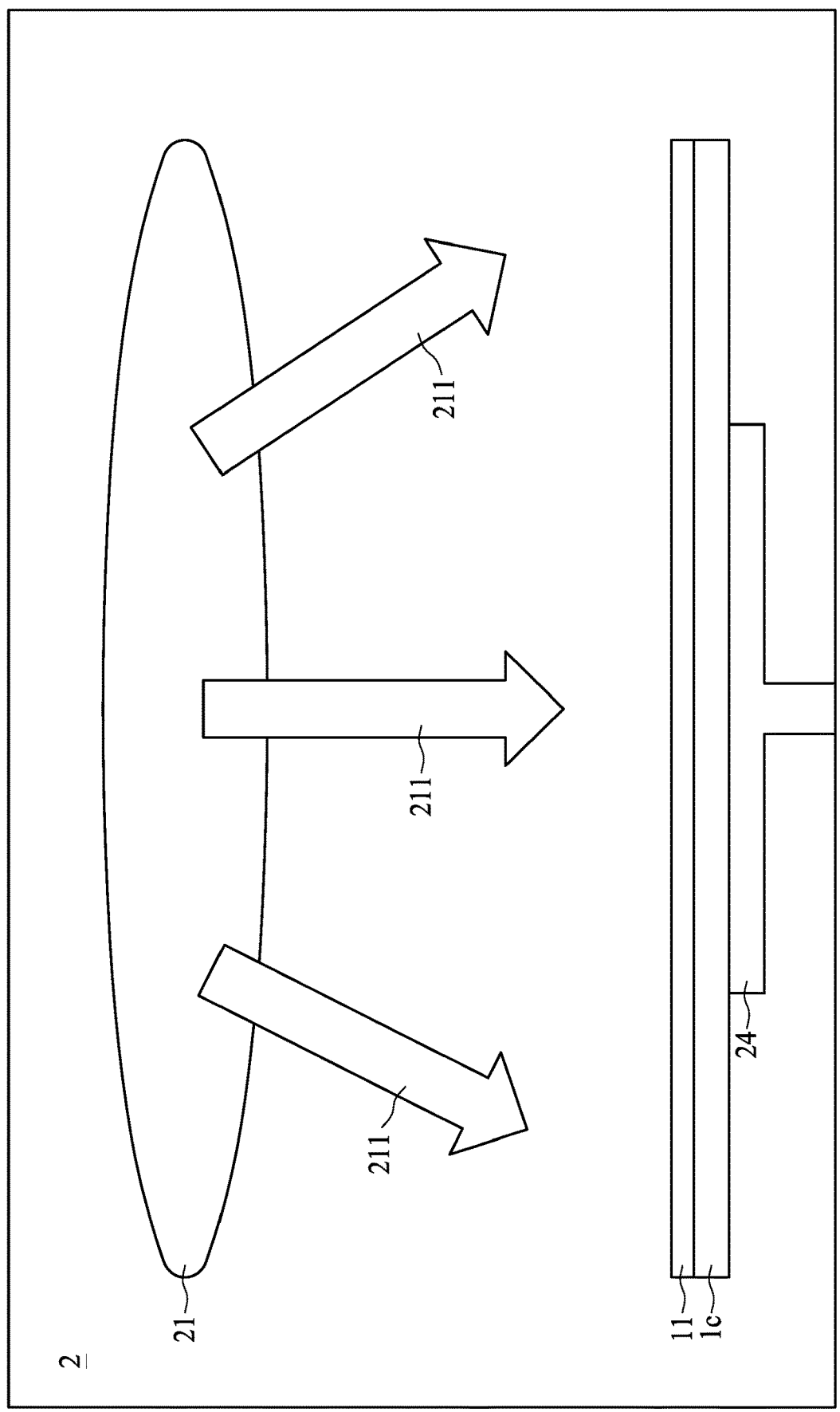
FIG. 3A is a schematic drawing illustrating an apparatus for performing an etching operation on a calibration wafer, in accordance with some embodiments of the present disclosure.

Referring to FIG. 3A, FIG. 3A is a schematic drawing illustrating an apparatus for performing an etching operation on a calibration wafer, in accordance with some embodiments of the present disclosure. Optionally, a calibration wafer is utilized to obtain a reference profile of etch rate across a wafer in an etch operation (such as plasma etch operation), thereby a local etch rate mapping (e.g., including etch rates at ⅓ of the radius, ⅝₁₅ of the radius, ⅘ of the radius and 1 of the radius) can be obtained. Specifically, a calibration wafer 1c faces a plasma generating region 21 in the apparatus 2 and is secured by a supporter 24. A masking layer 11 is formed above the calibration wafer 1c, and the plasma generating region 21 generates ions 211 to remove a portion of the calibration wafer 1c not covered by the masking layer 11.

In some embodiments, the calibration wafer 1c is a p-type semiconductor substrate (P-Substrate) or an n-type semiconductor substrate (N-Substrate) comprising silicon. In some other alternative embodiments, the calibration wafer 1c includes other elementary semiconductor, such as germanium; a compound semiconductor including silicon carbide, gallium arsenic, gallium phosphide, indium phosphide, indium arsenide, and/or indium antimonide; an alloy semiconductor including silicon germanium (SiGe), gallium arsenide phosphide (GaAsP), aluminum indium arsenide (AlInAs), aluminum gallium arsenide (AlGaAs), indium gallium arsenide (InGaAs), indium gallium phosphide (InGaP), indium gallium arsenide phosphide (InGaAsP), combinations thereof, or the like. In some other embodiments, the calibration wafer 1c is a semiconductor on insulator (SOI). In some other embodiments, the calibration wafer 1c may include a doped epitaxial layer, a gradient semiconductor layer, and/or a semiconductor layer overlying another different type semiconductor layer, such as a silicon layer on a silicon germanium layer. The calibration wafer 1c may or may not include doped regions, such as a p-well, an n-well, or combination thereof. In some other embodiments, one or more films or layers may be formed on the calibration wafer 1c, such as oxide layer, silicon oxide film, insulation layer, epitaxial layer, or the like. In some other embodiments, the calibration wafer 1c may include fabricated device or device during an intermediate stage of a fabrication operation. Generally, the calibration wafer 1c may be substantially identical with wafers subjected to a same etch operation subsequently. A diameter of the calibration wafer 1c may be 1 inch, 2 inch, 3 inch, 4 inch, 150 mm, 200 mm, 300 mm, 450 mm, 670 mm, or any other suitable size for performing coating or plasma etching.

In some embodiments, the masking layer 11 is a photoresist layer, and may be formed by coating. In some embodiments, the reference thickness profile of the masking layer 11 may be uniform. In some embodiments, the reference thickness profile of the masking layer 11 may be non-uniform, for example, formed by similar operations subsequently discussed in FIG. 4 to FIG. 9B.

Figure 3B:
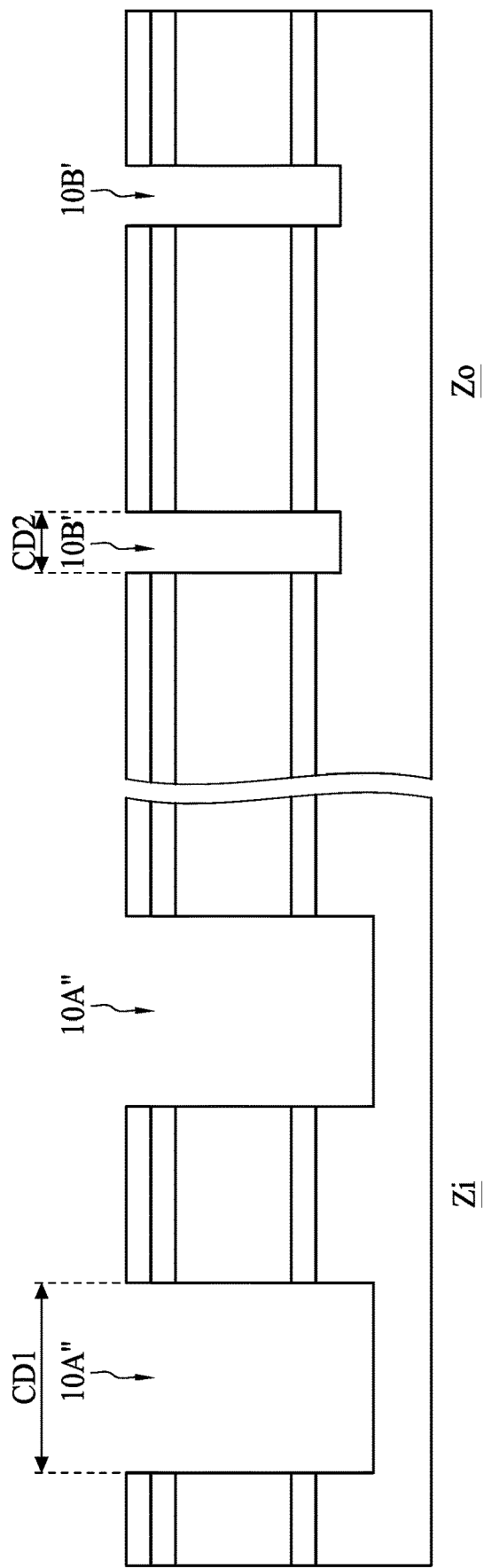
FIG. 3B is a schematic drawing illustrating a cross sectional view of a plurality of trenches formed in a calibration wafer, in accordance with some embodiments of the present disclosure.

Referring to FIG. 3B, FIG. 3B is a schematic drawing illustrating a cross sectional view of a plurality of trenches formed in a calibration wafer, in accordance with some embodiments of the present disclosure. By performing dry etch operation, such as plasma etching operation, a plurality of trenches 10A" and 10B" are formed in the calibration wafer 1c. As previously discussed, due to bulk plasma effect, a critical dimension CD1 of trenches 10A" in an inner region Zi may be greater than a critical dimension CD2 of trenches 10B" in an outer region Zo due to non-uniform local etch rate, wherein a local plasma etch rate in the inner region Zi may be greater than a local etch rate in the outer region Zo. In some embodiments, a depth of trenches 10A" in the inner region Zi may be greater than a depth of trenches 10B" in the outer region Zo. In some embodiments, the trenches 10B" in the outer region Zo may be underetched due to lower local etch rate, thus general product yield per wafer may be decreased.

Figure 3C:
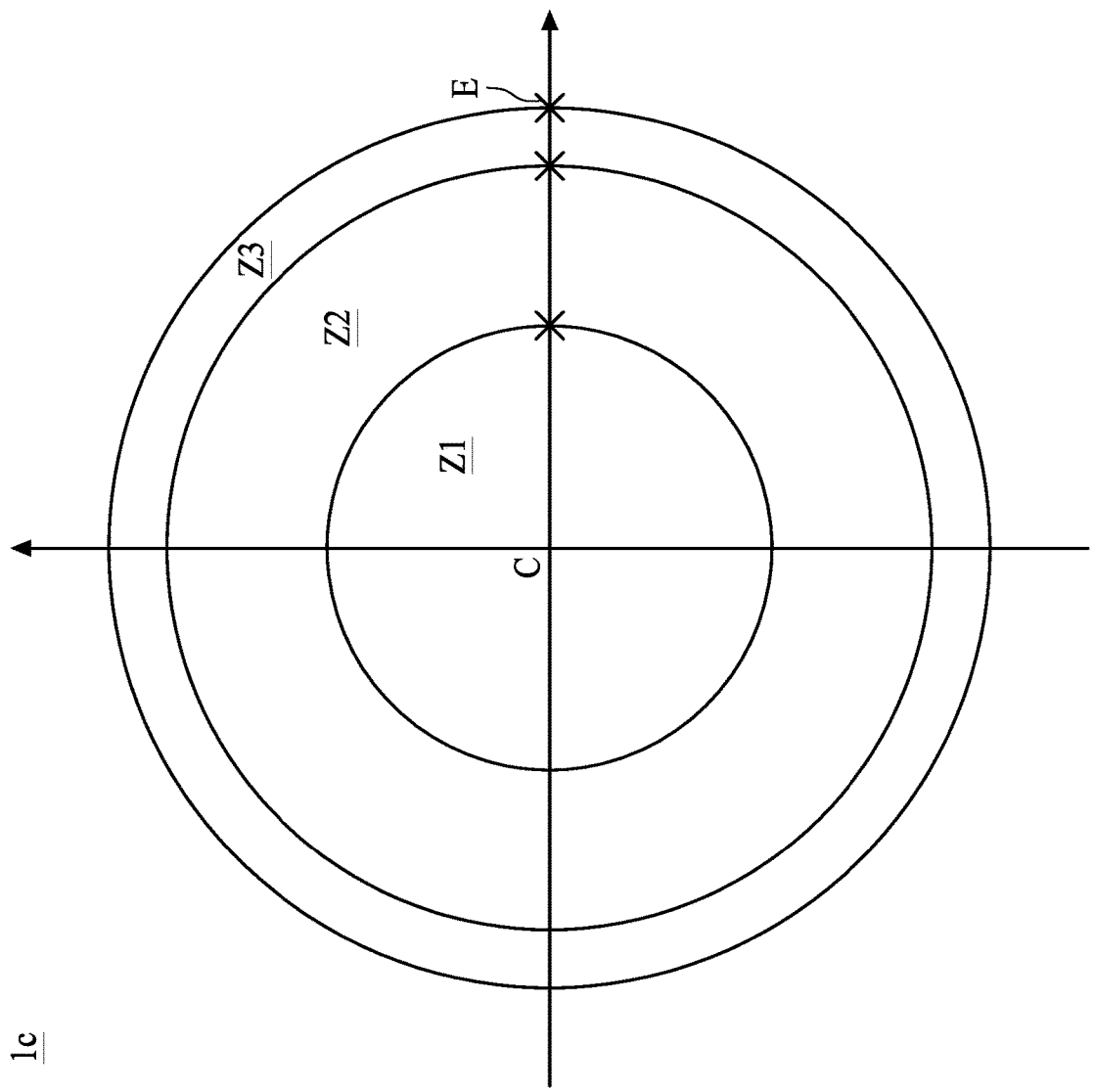
FIG. 3C shows a calibration wafer from a top view perspective, in accordance with some embodiments of the present disclosure.

Referring to FIG. 3B and FIG. 3C, FIG. 3C shows a calibration wafer from a top view perspective, in accordance with some embodiments of the present disclosure. A local masking layer thickness profile can be calculated based on the obtained profile of critical dimensions of trenches formed in different radial locations. Specifically, a distribution of critical dimensions of trenches across the calibration wafer 1c can be obtained by various techniques of statistical sampling. A plurality of regions can be decided by categorizing the critical dimensions of trenches in the calibration wafer 1c, thereby a thickness of the masking layer 11 in respective regions can be determined according to the critical dimensions of trenches. Alternatively stated, in order to form a plurality of trenches with improved uniformity, a thickness of the masking layer 11 in each region can be individually determined according to the critical dimensions of trenches therein, thereby compensating such non-uniform distribution of critical dimensions of trenches across the calibration wafer 1c. Specifically, a thickness of to-be-formed masking layer 11 in a region having trenches with less critical dimension can be adjusted to be thicker than a thickness of to-be-formed masking layer 11 in a region having trenches with greater.

The plurality of regions at least includes one outer region and one inner region. In some embodiments, the calibration wafer 1c can be divided into a plurality of eccentric regions. For example, the outer region can be a region at a wafer edge having a predetermined width, for example, at least greater than 0.01% of a diameter of the calibration wafer 1c. As the example shown in FIG. 3C, the calibration wafer 1c is divided into three eccentric regions Z1, Z2, and Z3. In some embodiments, the boundaries of the regions are decided by the profile of critical dimension of trenches. Alternatively, the region can be directly defined by radius from a center C of the calibration wafer 1c. For example, a calibration wafer 1c with diameter of 450 mm can be divided as three regions, including region Z1 (radius within 75 mm from center C), region Z2 (radius within a range from 75 mm to 150 mm from center C), and region Z3 (radius within a range from 150 mm to the wafer edge E). It should be noted that the present disclosure is not limited to dividing the calibration wafer 1c into three regions, and a distance between the center C and each boundaries may, or may not be uniform. Furthermore, since the calibration wafer 1c may not be a perfect circle, herein the center C of the calibration wafer 1c may be deemed as any point within a region directly adjacent to a geometrical center of the calibration wafer 1c, for example, within 20 mm from the geometrical center of the calibration wafer 1c.

In some embodiments, in order to improve the accuracy of adjusting a thickness profile of to-be-formed masking layer 11 for compensating the non-uniform distribution of critical dimension of trenches across the calibration wafer 1c, multiple calibration wafers 1c with different thickness or thickness profile thereon can be utilized. Thereby a thickness profile of to-be-formed masking layer 11 for forming critical dimension of trenches with improved uniformity can optionally be obtained by trial or by calculation. It is noteworthy that non-uniformed thickness profile of the masking layer 11 can be formed by methods subsequently discussed in FIG. 4 to FIG. 10B.

Figure 4:
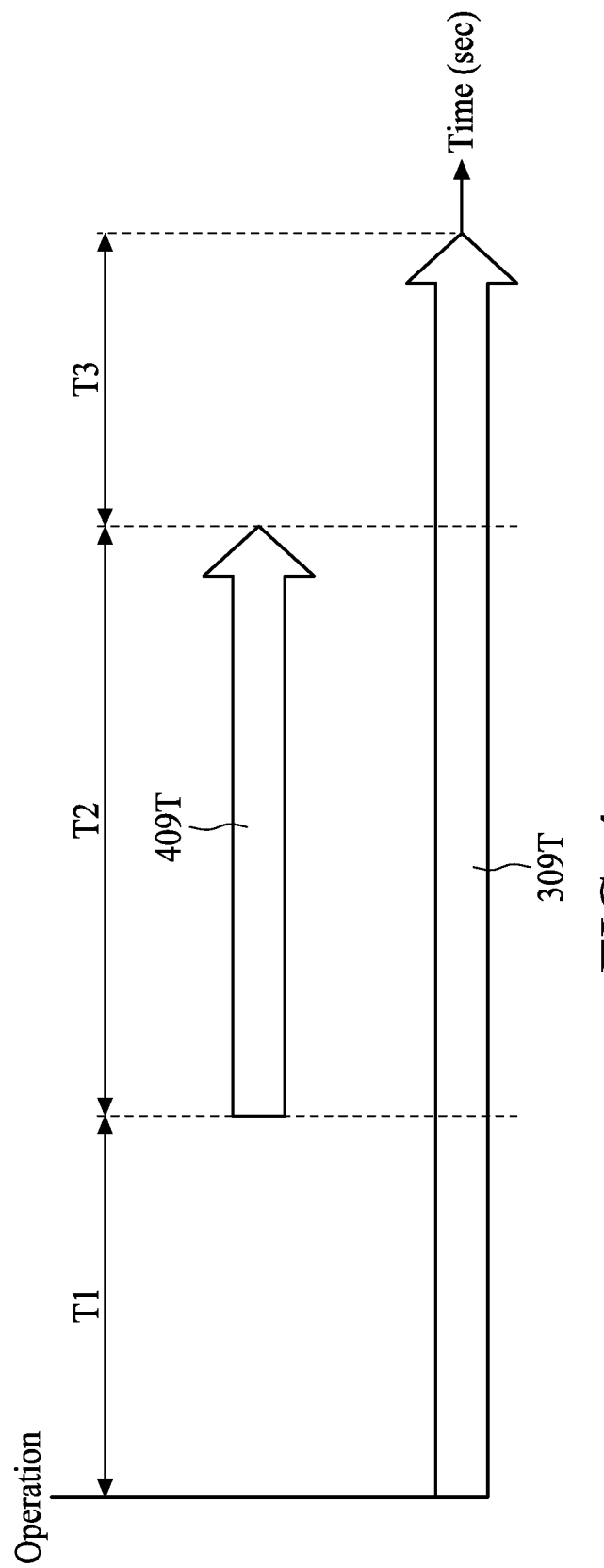
FIG. 4 is a timeline diagram showing a sequence of forming a masking layer, in accordance with some embodiments of the present disclosure.
Figure 5:
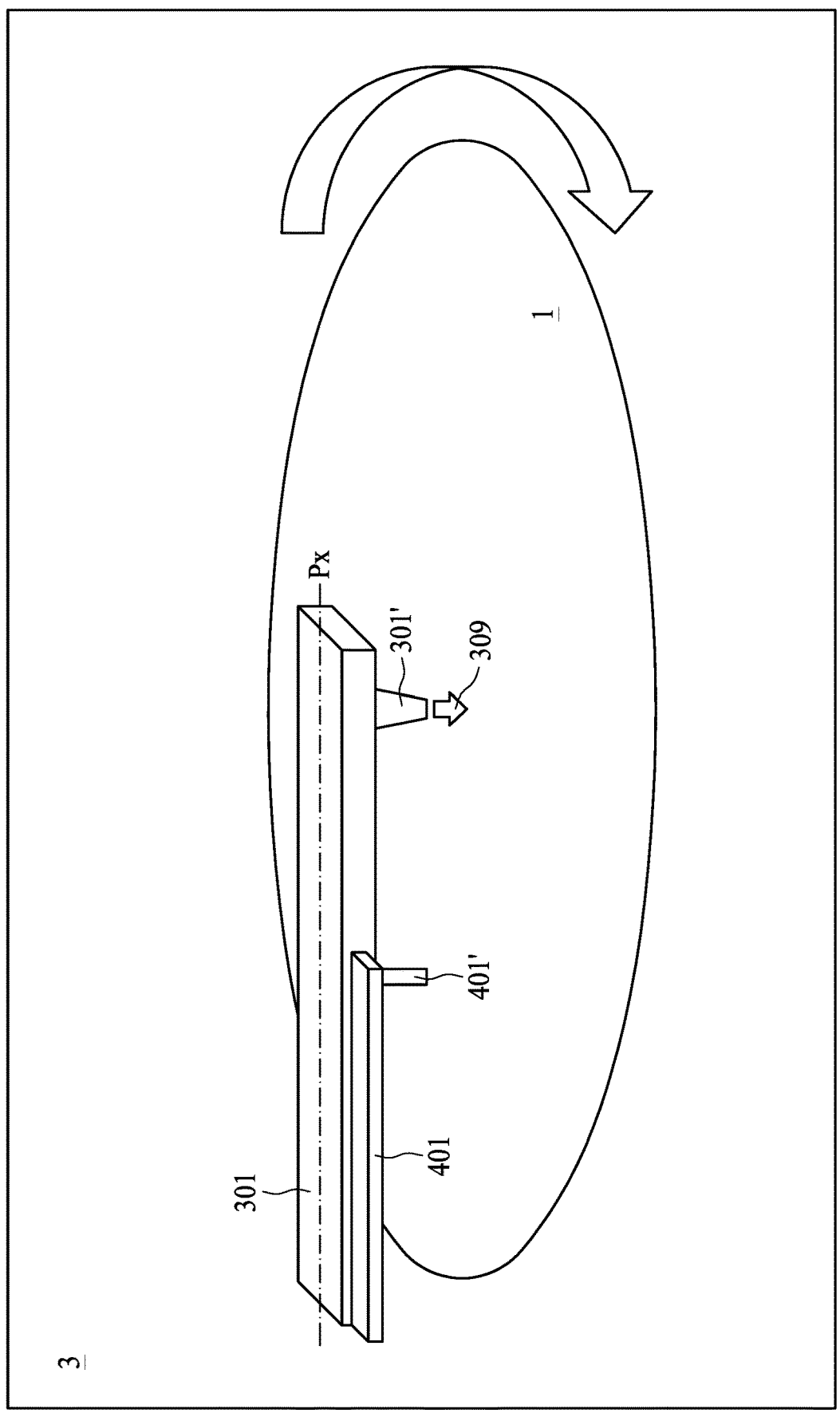
FIG. 5 is a perspective view showing an apparatus for forming a masking layer, in accordance with some embodiments of the present disclosure.
Figure 5A:
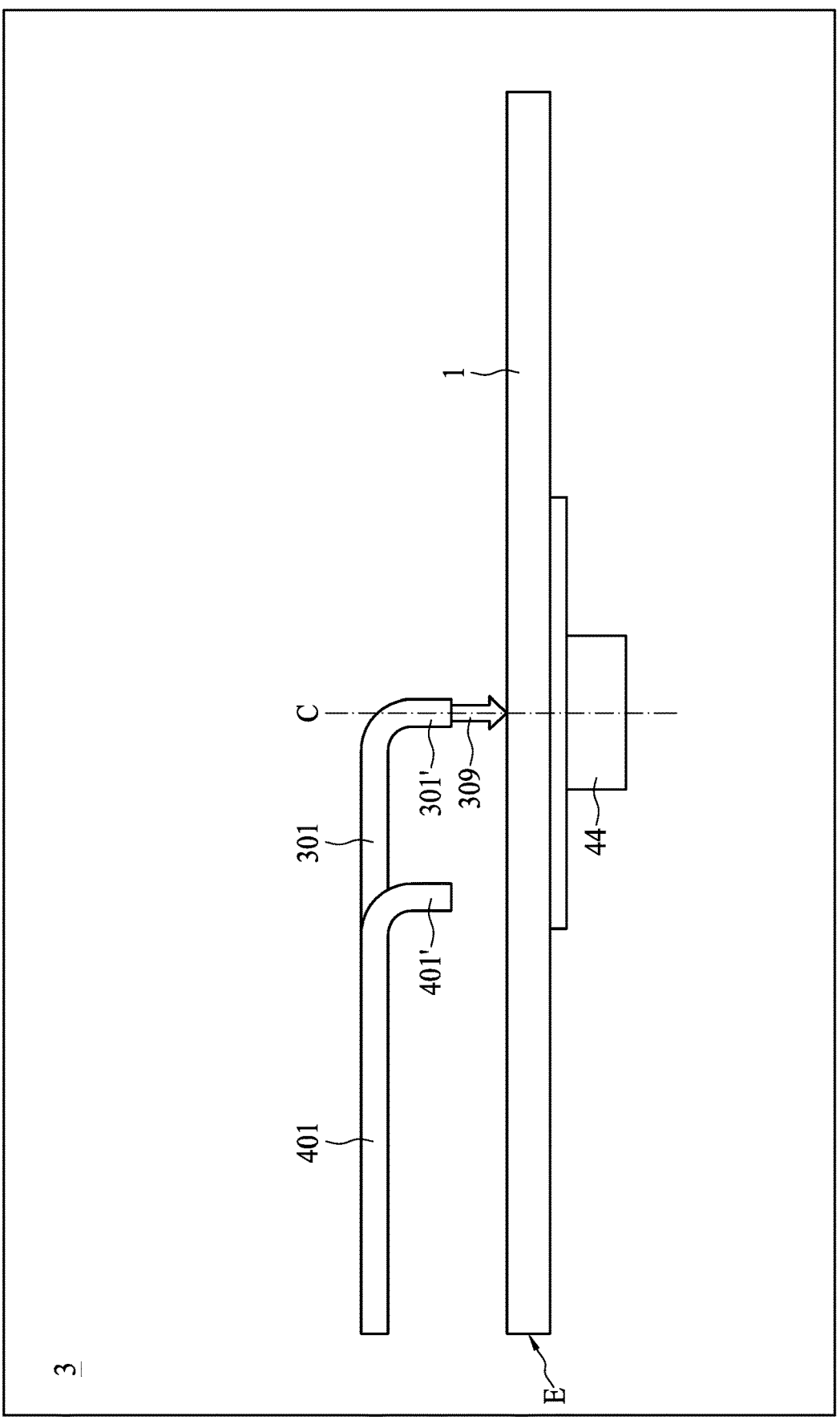
FIG. 5A is a cross sectional view showing an apparatus for forming a masking layer, in accordance with some embodiments of the present disclosure.
Figure 6:
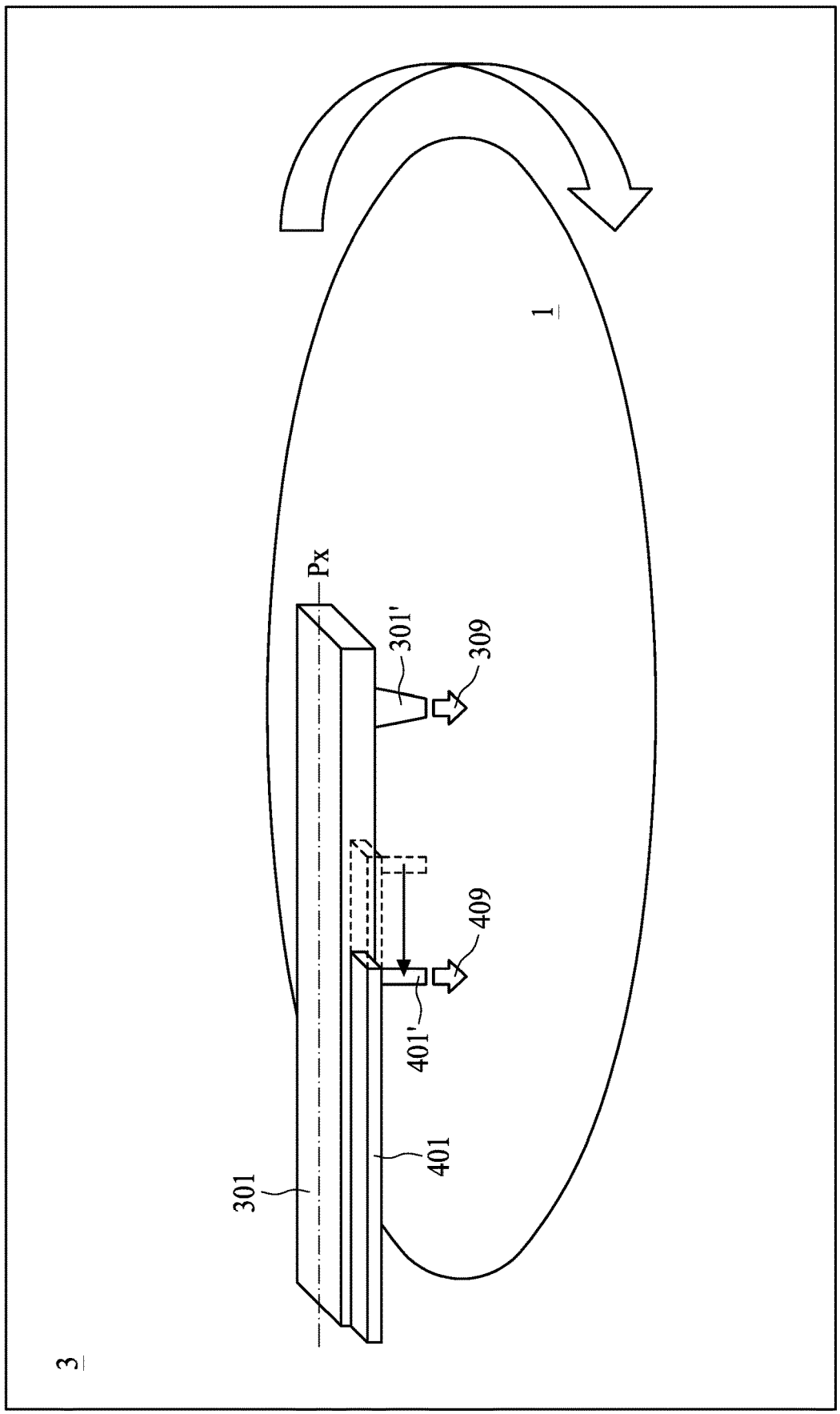
FIG. 6 is a perspective view showing an apparatus for forming a masking layer, in accordance with some embodiments of the present disclosure.
Figure 7:
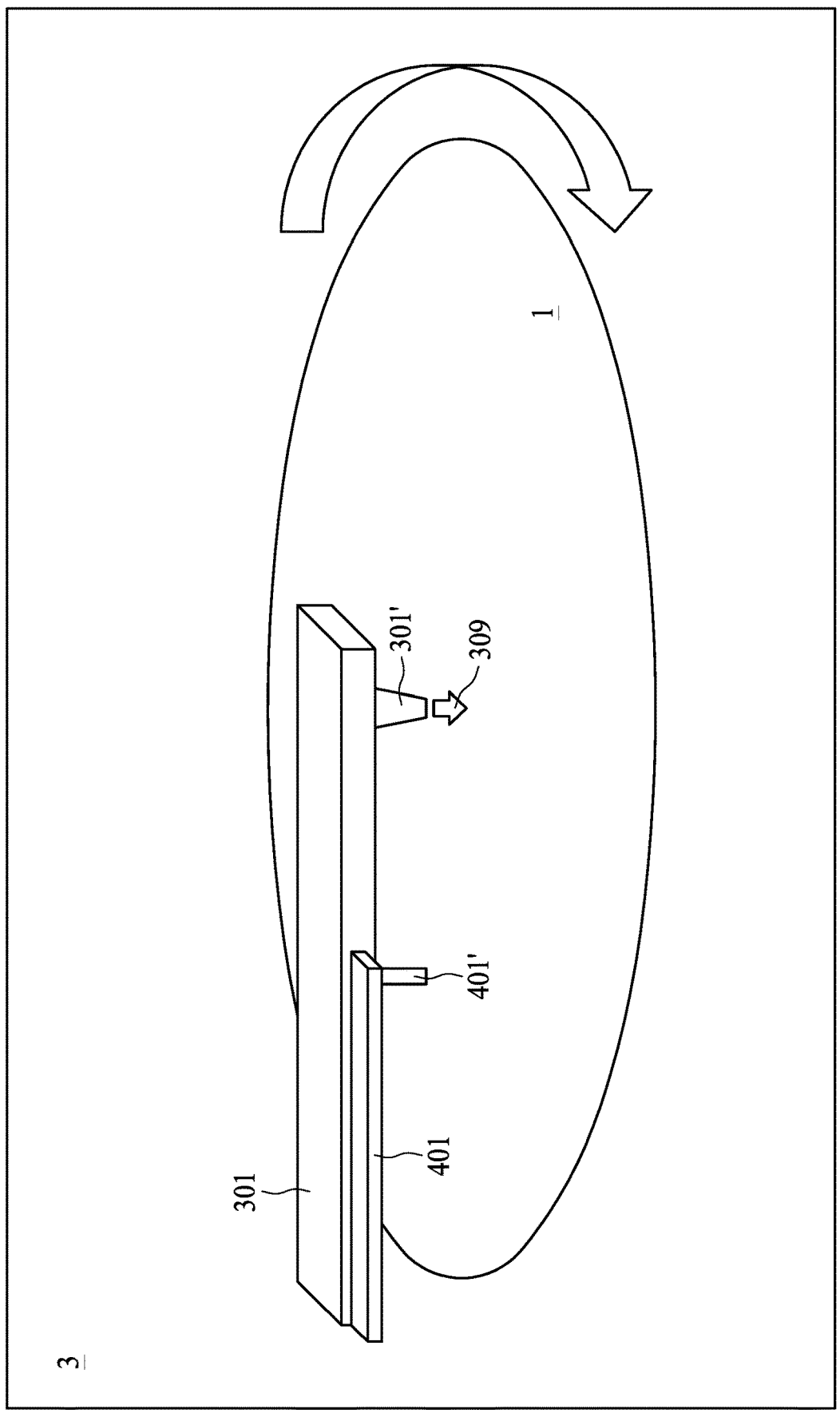
FIG. 7 is a perspective view showing an apparatus for forming a masking layer, in accordance with some embodiments of the present disclosure.
Figure 11:
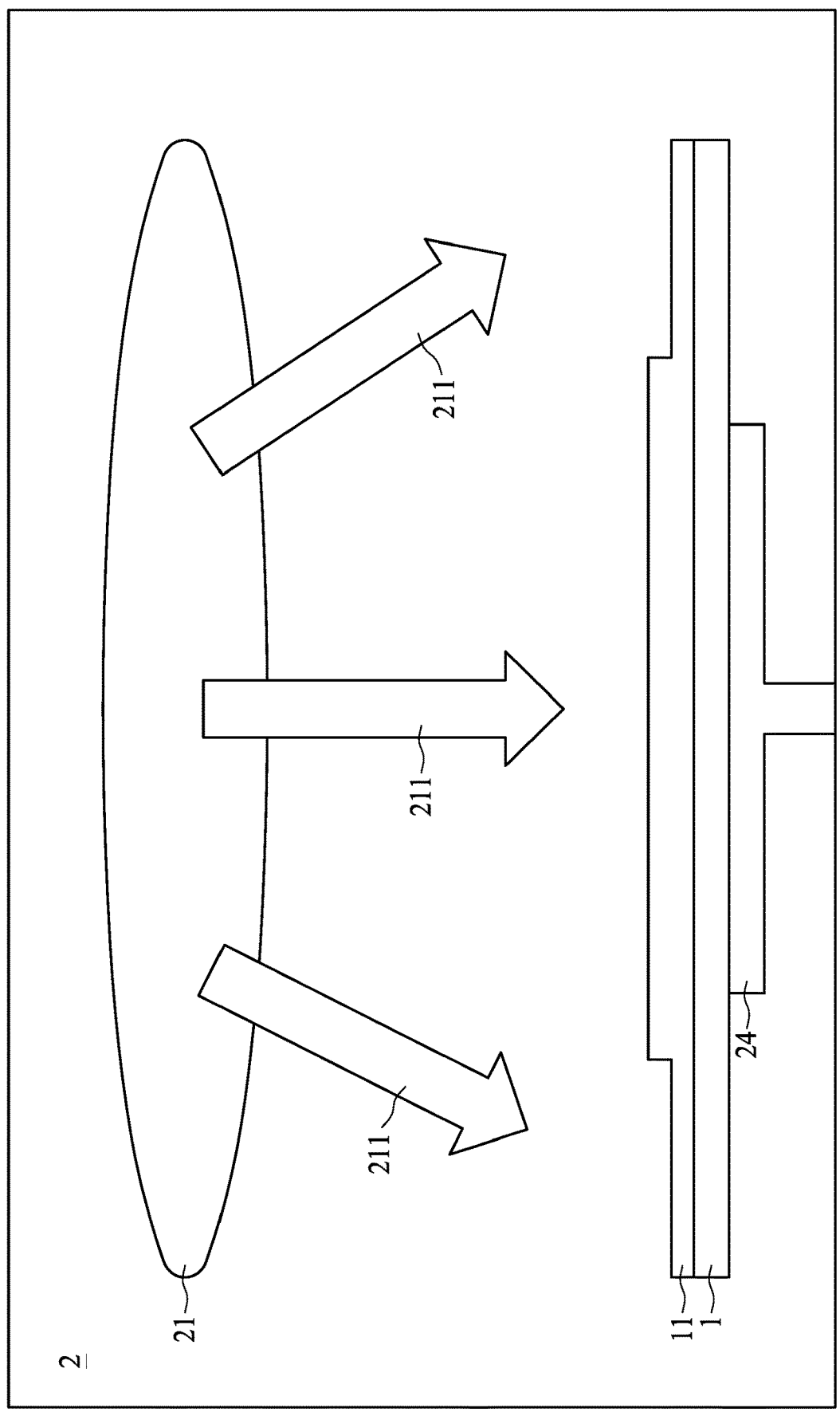
FIG. 11 is a schematic drawing illustrating an apparatus for performing an etching operation on a wafer, in accordance with some comparative embodiments of the present disclosure.

Referring to FIG. 4, FIG. 5, FIG. 5A, FIG. 6 and FIG. 7, FIG. 4 is a timeline diagram showing a sequence of forming a masking layer, FIG. 5 is a perspective view showing an apparatus for forming a masking layer, FIG. 5A is a cross sectional view showing an apparatus for forming a masking layer, FIG. 6 is a perspective view showing an apparatus for forming a masking layer, FIG. 7 is a perspective view showing an apparatus for forming a masking layer, in accordance with some embodiments of the present disclosure. A wafer 1 is provided, and a masking layer 11 (as shown in FIG. 11) may be formed by dispensing a first liquid 309 and a second liquid 409 (as shown in FIG. 6) on the wafer 1, wherein the second liquid 409 is a remover of the first liquid 309, and the masking layer 11 is solidified first liquid 309. In some embodiments, the first liquid 309 is photoresist, and the second liquid 409 is solvent for removing photoresist.

In some embodiments, the wafer 1 is a p-type semiconductor substrate (P-Substrate) or an n-type semiconductor substrate (N-Substrate) comprising silicon. In some other alternative embodiments, the wafer 1 includes other elementary semiconductor, such as germanium; a compound semiconductor including silicon carbide, gallium arsenic, gallium phosphide, indium phosphide, indium arsenide, and/or indium antimonide; an alloy semiconductor including silicon germanium (SiGe), gallium arsenide phosphide (GaAsP), aluminum indium arsenide (AlInAs), aluminum gallium arsenide (AlGaAs), indium gallium arsenide (InGaAs), indium gallium phosphide (InGaP), indium gallium arsenide phosphide (InGaAsP), combinations thereof, or the like. In some other embodiments, the wafer 1 is a semiconductor on insulator (SOI). In some other embodiments, the wafer 1 may include a doped epitaxial layer, a gradient semiconductor layer, and/or a semiconductor layer overlying another different type semiconductor layer, such as a silicon layer on a silicon germanium layer. The wafer 1 may or may not include doped regions, such as a p-well, an n-well, or combination thereof. In some other embodiments, one or more films or layers may be formed on the wafer 1, such as oxide layer, silicon oxide film, insulation layer, epitaxial layer, the like. In some other embodiments, the wafer 1 may include fabricated device or device during an intermediate stage of a fabrication operation. A diameter of the wafer 1 may be 1 inch, 2 inch, 3 inch, 4 inch, 150 mm, 200 mm, 300 mm, 450 mm, 670 mm, or any other suitable size for performing coating or plasma etching.

An apparatus 3 at least include a first arm 301 configured to dispense the first liquid 309 from a first nozzle 301', and a second arm 401 configured to dispense the second liquid 409 from a second nozzle 401'. The first arm 301 and the second arm 401 are above a wafer spinner 44. Specifically, the first liquid 309 is dispensed at a first location on the wafer 1, and the second liquid 409 is dispensed at a second location on the wafer 1, wherein the second location is different from the first location. In some embodiments, the second location is between the first location and an edge of the wafer, and the first location is closer to a center of the wafer spinner 44 than the second location. In some embodiments, the first location is at a center of the wafer, and the first nozzle is aligned with the first location. It should be noted that herein the center of the wafer 1 may be deemed as any point within a region directly adjacent to a geometrical center of the wafer 1, for example, within 20 mm from the geometrical center of the wafer 1. By this configuration, an outer region of the first liquid 309 can be partially removed by the second liquid 409, thus after the dispensing of the first liquid 309 and the second liquid 409 are finished, the formed masking layer 11 (which may be a photoresist layer) may have a non-uniform thickness profile, wherein a thickness of the masking layer 11 at the first location is thicker than a thickness of the masking layer 11 at the second location.

It should be noted that the first location and the second location in the present disclosure can be a projection location of the first nozzle 301' and the second nozzle 401' on the wafer 1 or on the wafer spinner 44 from a perspective of the first arm 301 and the second arm 401. Whereas since the wafer 1 may be rotated during dispensing the first liquid 309 and the second liquid 409, the first locations and the second locations may collectively constitute an annular shape respectively from a perspective of the wafer 1 or the wafer spinner 44. Furthermore, since a radius of a chuck of the wafer spinner 44 may be less than a radius of the wafer 1, the second location may be outside of an edge of the wafer spinner 44 in some embodiments. Thus "a second location of the wafer spinner 44" may be a projected location of the second nozzle 401' on an imaginary plane extended from a top surface of the wafer spinner 44.

In some embodiments, as shown in FIG. 4, a duration 409T of dispensing the second liquid 409 is within a duration 309T of dispensing the first liquid 309. For example, the first liquid 309 is dispensed at the first location for a first period of time T1, subsequently the first liquid 309 is dispensed at the first location and the second liquid 409 is dispensed at the second location simultaneously for a second period of time T2, and subsequently the first liquid 309 is dispensed only at the first location for a third period of time T3, wherein the first period of time T1, the second period of time T2, and the third period of time T3 are continuous. Alternatively stated, the dispensing of the second liquid 409 at the second location may be subsequent to the dispensing of the first liquid 309, and the dispensing of the second liquid 409 at the second location terminates prior to the termination of the dispensing of the first liquid 309. In some embodiments, prior to dispensing the first liquid 309 on the wafer 1, the wafer 1 is spun by a wafer spinner 44, wherein the rotator may be a chuck, a pedestal, or the like. In some embodiments, the spinning of the wafer 1 halts subsequent to the termination of the dispensing of the first liquid 309.

In some embodiments, a mechanism is programmed to move the first arm 301 along a primary axis Px thereof. The primary axis Px may be an extension/stowing direction of the first arm 301, or may be a central axis of the first arm 301, or may be other predetermined reference axis. The mechanism can move the first arm 301 thus the first nozzle 301' can be aligned with the first location (such as the center of the wafer spinner 44 or the center of the wafer 1) prior to dispensing the first liquid 309. Another mechanism is programmed to move the second arm 401 along or substantially parallel to the primary axis Px of the first arm 301, thus the second nozzle 401' is aligned with the second location of the wafer spinner 44. In some embodiments, the first arm 301 is directly stacked over the second arm 401. In some other embodiments, the second arm 401 is adjacent to the first arm 301. In some other embodiments, the second arm 401 is connected to the first arm 301. The aforesaid mechanism may include means for moving an arm, which may include belt, rail, motor, linkage mechanism, or the like. By this configuration, the complexity of controlling each of the first arm 301 and the second arm 401 can be reduced due to the limited degree of freedom. In some other alternative embodiments, the first arm 301 and the second arm 401 are disposed along different axis or at a different position, depending on the configuration of the apparatus 3.

In some embodiments, referring to FIG. 6, the second location is altered prior to dispensing the first liquid 309 and the second liquid 409, and the second location is fixed during dispensing the second liquid 409. In some embodiments, the wafer 1 can be divided into a plurality of regions, wherein the second location is within a region where a local thickness of masking layer 11 to be formed is relatively thinner. As previously discussed, the thickness of masking layer 11 to be formed is decided based on a critical dimension to be formed on the wafer 1. Since a subsequent plasma rate may be lower at an outer region than at an inner region, a critical dimension at an inner region may be greater than a critical dimension at an outer region if the masking layer has a uniform thickness profile. In order to compensate such phenomena, the location of the second location and the thickness profile of the to-be-formed masking layer 11 are decided based on a critical dimension to be formed on the wafer 1. In some embodiments, the second location is within an outer region, and the first location is within an inner region. In some embodiments, the regions can be directly defined by predetermined boundaries from the center of the wafer 1. For example, a wafer 1 with diameter of 300 mm can be divided as an inner region (e.g. radius within 75 mm from center) and an outer region (e.g. radius within a range from 75 mm to the wafer edge E). Thereby the second liquid 409 may partially remove a portion of the first liquid 309 in the outer region during dispensing operation, thus a thickness of the masking layer 11 in the inner region may be greater than a thickness of the masking layer 11 in the outer region.

Alternatively, the second location and the boundaries of regions can be decided by the results previously obtained by the calibration wafer 1c, as discussed in FIG. 3A to FIG. 3C. Specifically, the regions divided on the wafer 1 can be referred to the counterparts of the calibration wafer 1c, which may be decided based on results of critical dimensions of formed trenches.

Referring to FIG. 7, subsequently the dispensing of the second liquid 409 is terminated, and the first liquid 309 continues to dispense at the first location for a period of time before all liquid dispensing being terminated. The first arm 301 and the second arm 401 may be stowed or moved away, and the wafer spinner 44 may stop spinning the wafer 1. Thence the first liquid 309 is solidified and the masking layer 11 is thereby formed (shown in FIG. 11). In some embodiments, a predetermined portion of the masking layer 11 is removed by development operation subsequently. Optionally, an edge bead removal operation can be performed to remove a portion of the masking layer 11 at an edge area of the wafer 1 in order to alleviate defects.

Figure 8A:
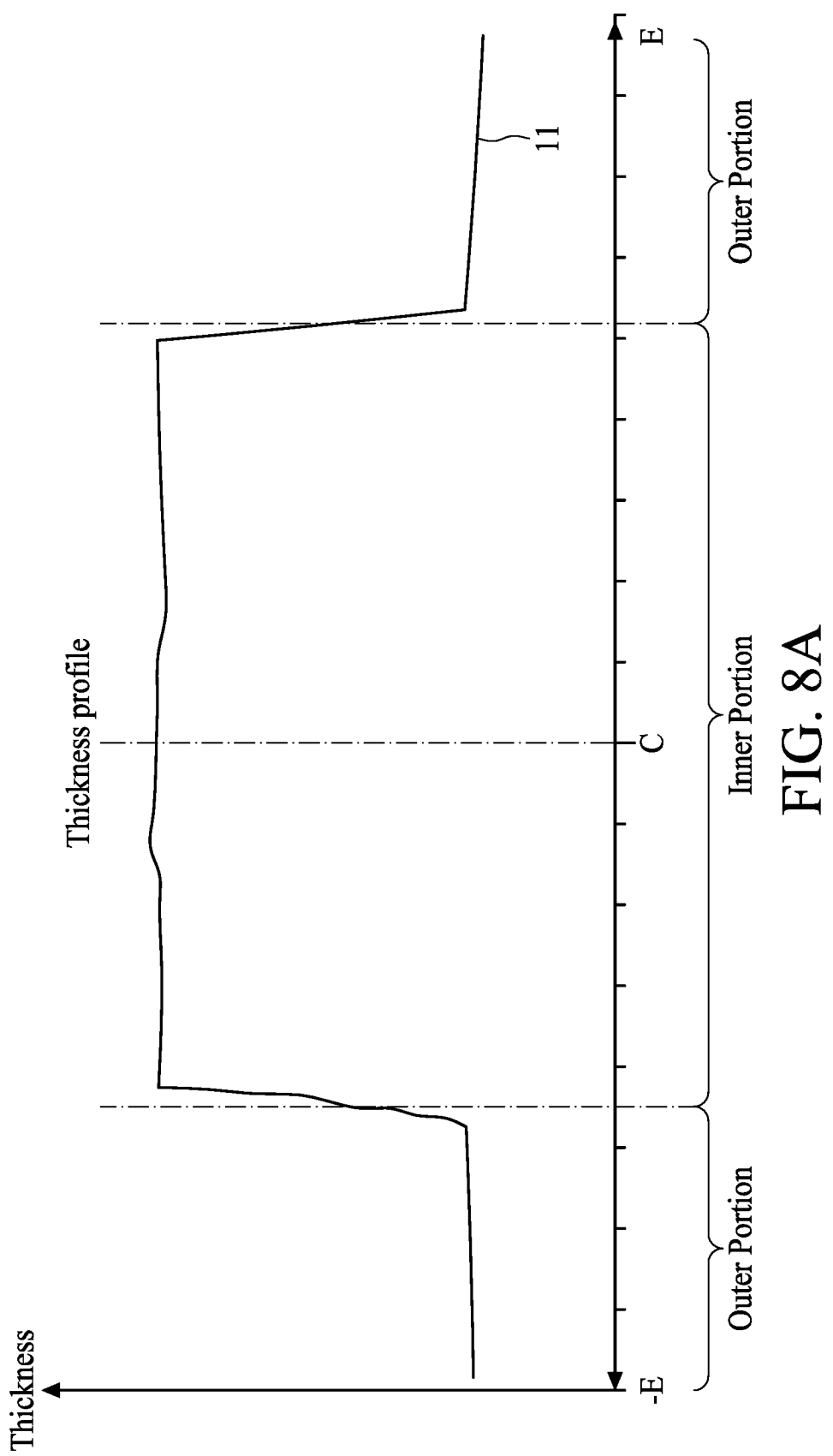
FIG. 8A shows a thickness profile of a masking layer formed on a wafer, according to some embodiments of present disclosure.

Referring to FIG. 8A, FIG. 8A shows a thickness profile of a masking layer formed on a wafer, according to some embodiments of present disclosure. As previously discussed, the masking layer 11 has a thickness in the inner region is greater than a thickness in the outer region since the second liquid partially remove the first liquid 309/masking layer 11 in the outer region.

Figure 8B:
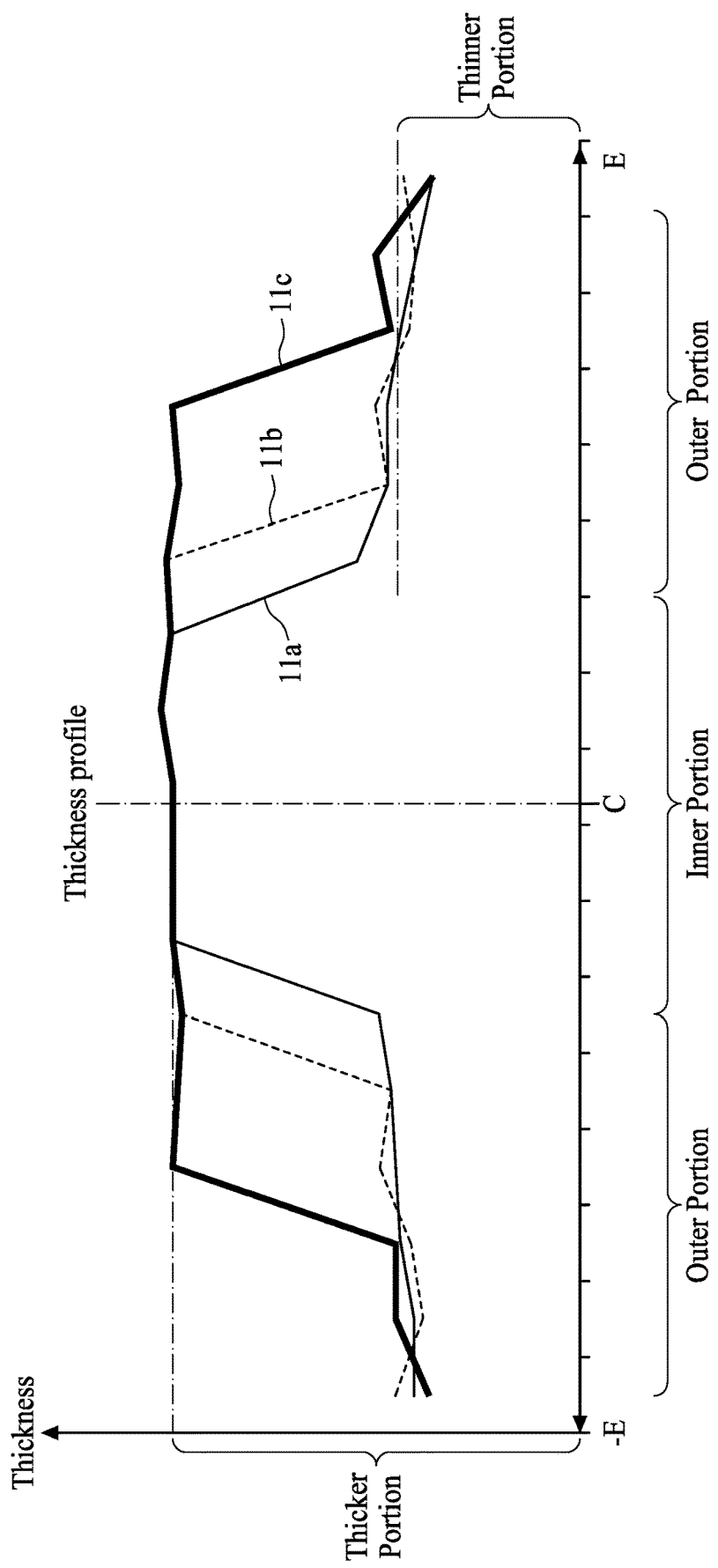
FIG. 8B shows a plurality of thickness profiles of masking layers formed on a wafer, according to some embodiments of present disclosure.

Referring to FIG. 8B, FIG. 8B shows a plurality of thickness profiles of masking layers formed on a wafer, according to some embodiments of present disclosure. The location of the second location on the wafer 1 is one of the factors contribute to the thickness profile of the masking layer 11. In order to control the thickness profile of the masking layer 11, the second location of dispensing the second liquid can be adjusted. As three examples of thickness profiles 11a, 11b, and 11c of masking layer 11 shown in FIG. 8B, if the second location is closer to the center C of the wafer 1 (profile 11a), the area of the inner portion (which is the thicker portion) of the masking layer 11 is relatively smaller; while if the second location is farther away from the center C of the wafer 1 (profile 11c), the area of the inner portion of the masking layer 11 is relatively larger. Alternatively stated, the area of the inner portion of the masking layer 11 is positively correlated to a distance between the second nozzle 401' and the center C.

Figure 8C:
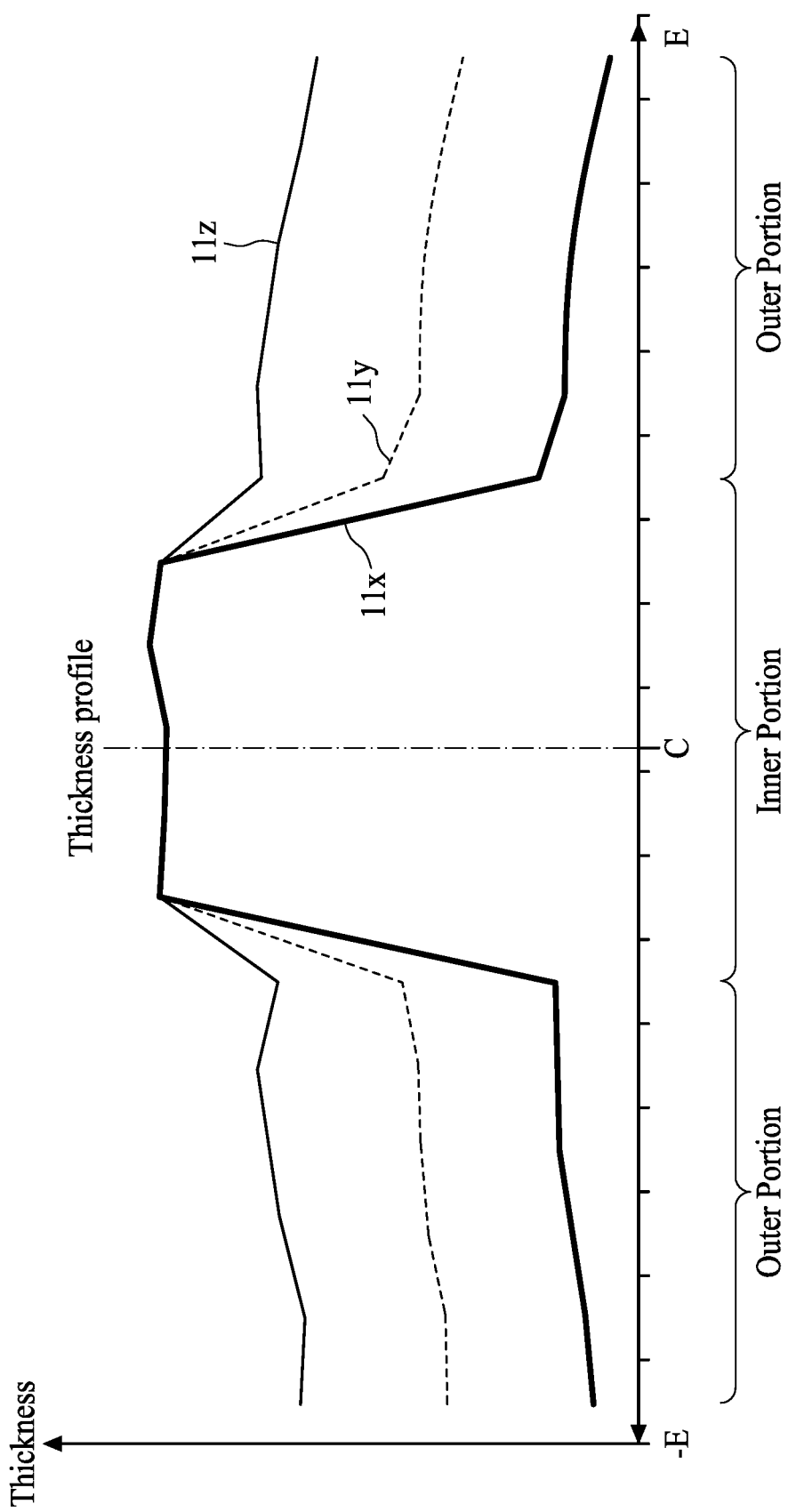
FIG. 8C shows a plurality of thickness profiles of masking layers formed on a wafer, according to some embodiments of present disclosure.

Referring to FIG. 8C, FIG. 8C shows a plurality of thickness profiles of masking layers formed on a wafer, according to some embodiments of present disclosure. Another factor contribute to the thickness profile of the masking layer 11 is the dispensing time 409T (as shown in FIG. 4) of the second liquid 409. In order to control the thickness profile of the masking layer 11, the dispensing time 409T of the second liquid 409 can be adjusted. As three examples of thickness profiles 11x, 11y, and 11z of masking layer 11 shown in FIG. 8C, if the dispensing time 409T of the second liquid 409 is relatively longer (profile 11x), the thickness of the outer portion (which is the thinner portion) of the masking layer 11 is relatively smaller; while if the dispensing time 409T of the second liquid 409 is relatively shorter (profile 11z), the thickness of the outer portion of the masking layer 11 is relatively greater. Alternatively stated, the thickness of the outer portion of the masking layer 11 is negatively correlated to the dispensing time 409T of the second liquid 409.

In some embodiments, the dispensing time 309T of the first liquid 309 is another factor contributing to the thickness profile of the masking layer 11. The dispensing time 309T of the first liquid 309 may be positively correlated to a thickness of the masking layer 11 in the outer region and/or in the inner region.

Figure 8D:
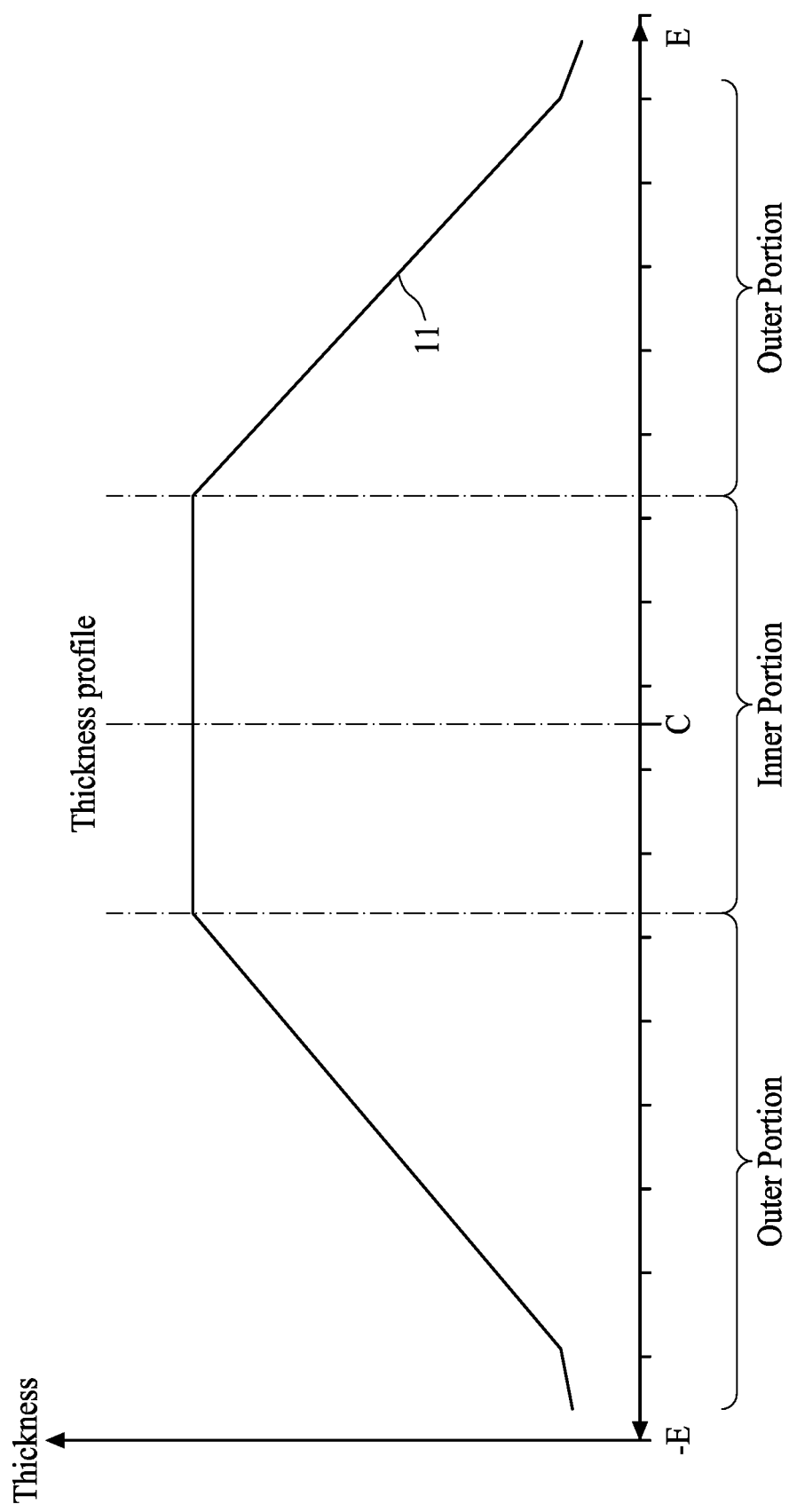
FIG. 8D shows a thickness profile of a masking layer formed on a wafer, according to some embodiments of present disclosure.

Referring to FIG. 6 and FIG. 8D, FIG. 8D shows a thickness profile of a masking layer formed on a wafer, according to some embodiments of present disclosure. In some embodiments, the second location is altered while dispensing the second liquid 409. In some embodiments, the mechanism moves the second arm 401 in a direction along the primary axis of the first arm 301 while dispensing the second liquid 409. By such configuration, the thickness profile of the masking layer 11 may include a sloped thickness profile in the region applied by the second liquid 409. Alternatively stated, a thickness of the masking layer 11 gradually increases from the wafer edge E toward the center C within an outer region.

Figure 9A:
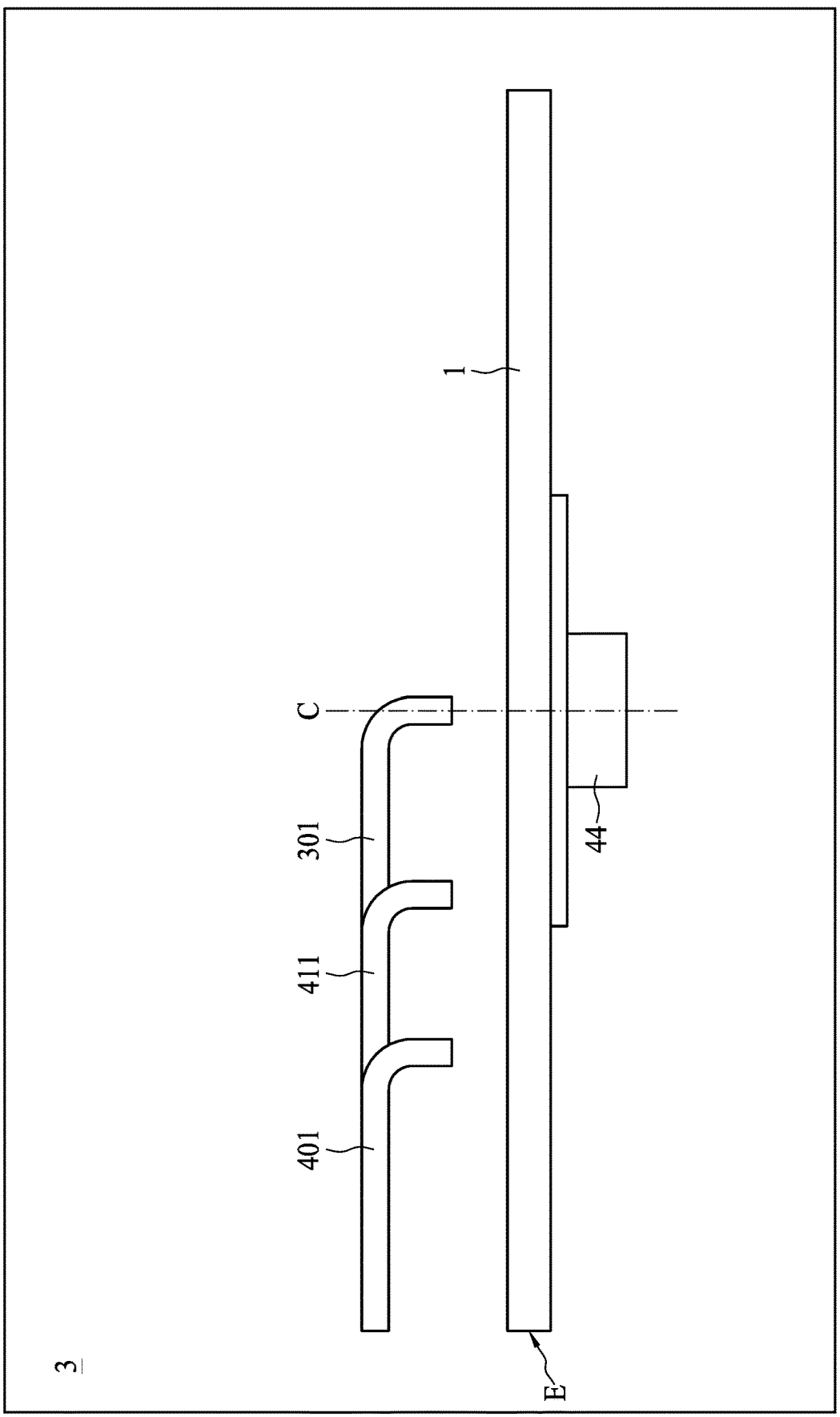
FIG. 9A is a cross sectional view showing an apparatus for forming a masking layer, in accordance with some embodiments of the present disclosure.
Figure 9B:
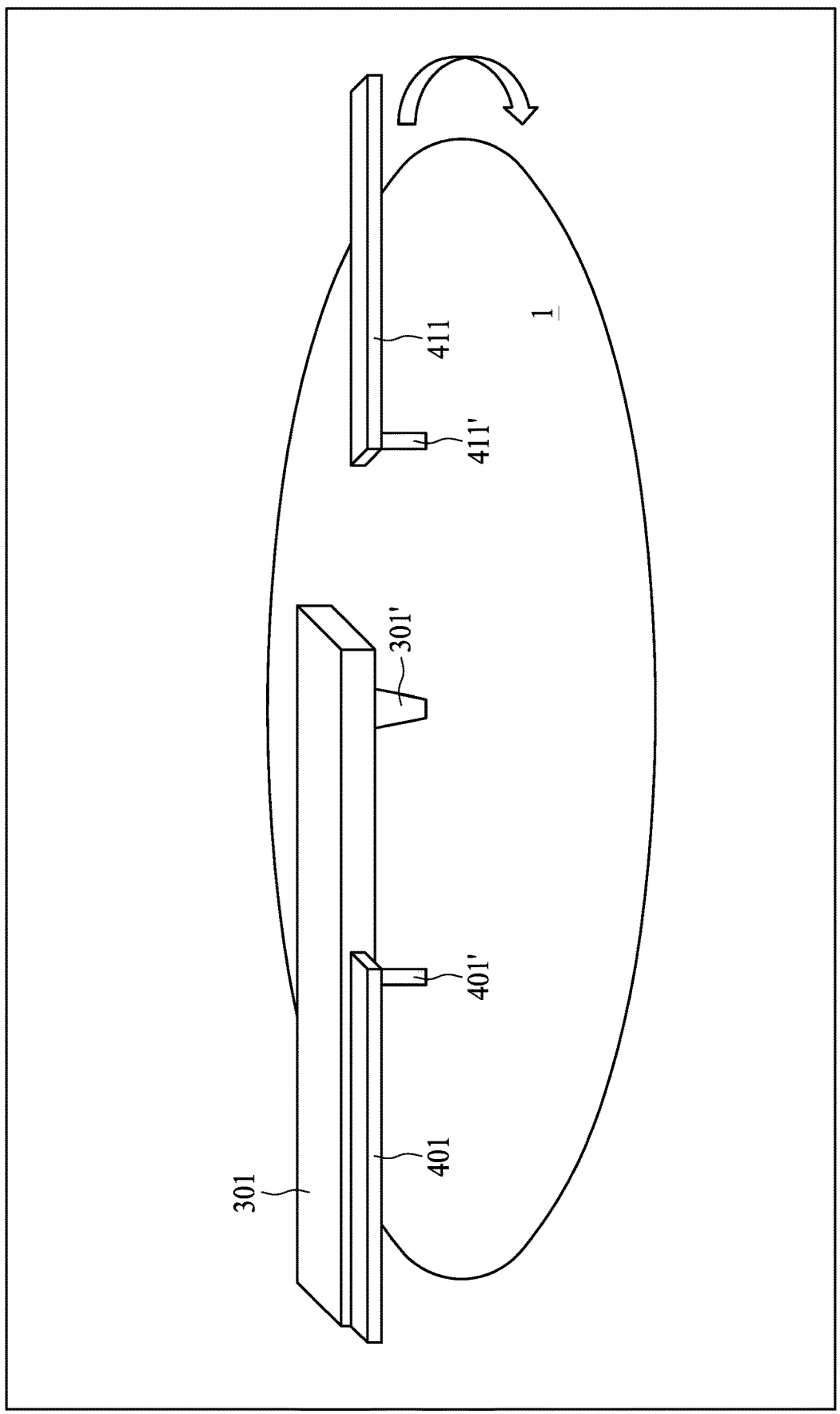
FIG. 9B is a perspective view showing an apparatus for forming a masking layer, in accordance with some embodiments of the present disclosure.

Referring to FIG. 9A and FIG. 9B, FIG. 9A is a cross sectional view showing an apparatus for forming a masking layer, FIG. 9B is a perspective view showing an apparatus for forming a masking layer, in accordance with some embodiments of the present disclosure. In some embodiments, one or more third arm 411 over the wafer spinner 44 is configured to dispense the second liquid 409 at a third location different from the first location and the second location. The third arm 411 has a third nozzle 411' configured to be aligned with the third location on the wafer spinner 44, wherein the second location of the second nozzle 401' is closer to the center of the wafer spinner 44 than the third location. By incorporating one or more third arm 411 in the apparatus 3, the thickness profile may have three or more different observable thicknesses of the thickness profile. Another mechanism is programmed to move the third arm 411 along or substantially parallel to the primary axis Px of the first arm 301. In some embodiments, the third arm 411 is directly stacked under the second arm 401. In some other embodiments, the third arm 411 is adjacent to the first arm 301 or the second arm 401. In some other embodiments, the third arm 411 is connected to the first arm 301 or the second arm 401. The aforesaid mechanism may include means for moving an arm, which may include belt, rail, motor, linkage mechanism, or the like. In some other alternative embodiments, the first arm 301, the second arm 401, and/or the third arm 411 are disposed along different axis, depending on the configuration of the apparatus 3. In some other alternative embodiments, two of the first arm 301, the second arm 401, and/or the third arm 411 are adjacently disposed, while another one is disposed along different axis or at a different position, as shown in FIG. 9B.

Figure 10A:
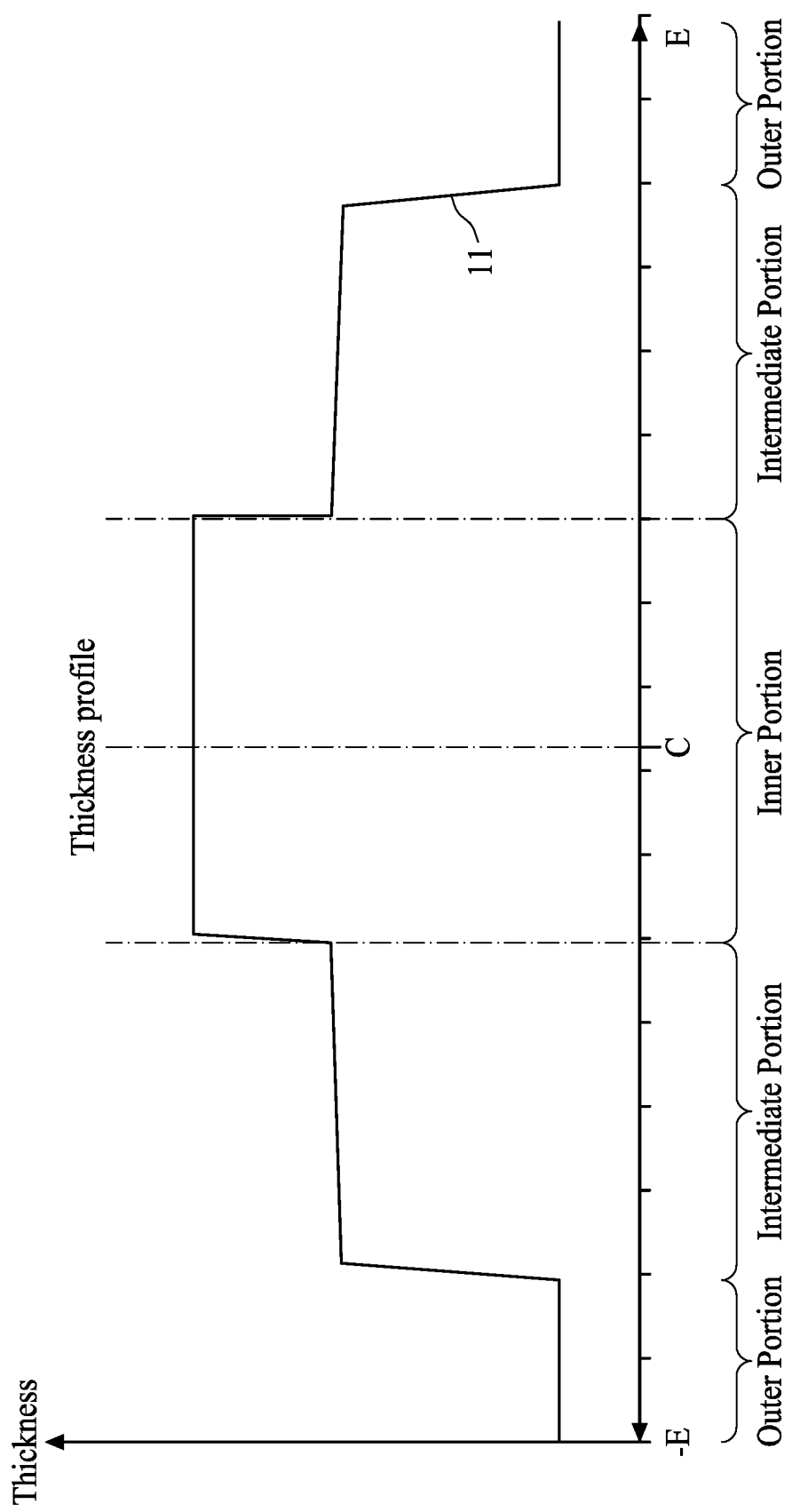
FIG. 10A shows a thickness profile of a masking layer formed on a wafer, according to some embodiments of present disclosure.
Figure 10B:
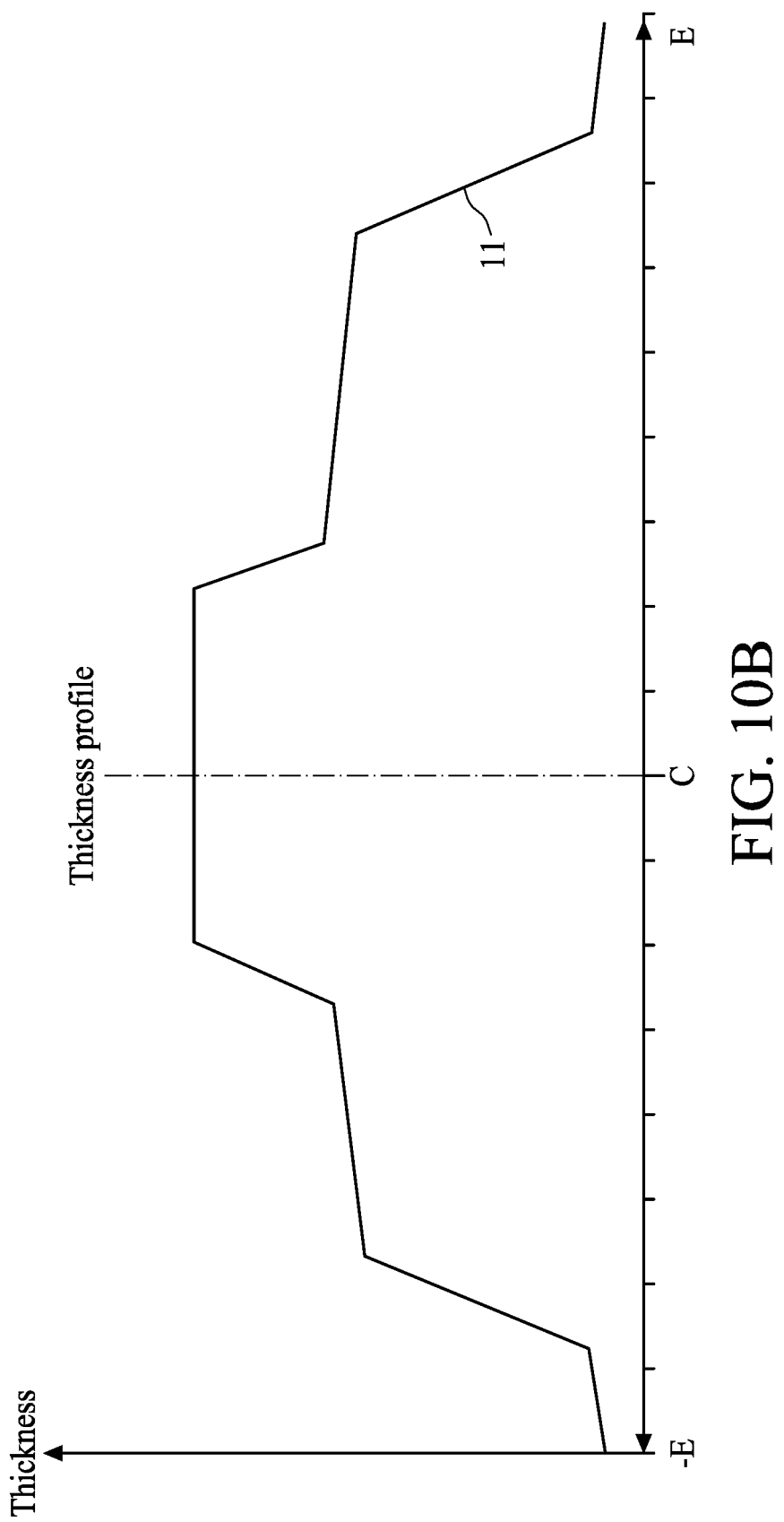
FIG. 10B shows a thickness profile of a masking layer formed on a wafer, according to some embodiments of present disclosure.

Referring to FIG. 10A, FIG. 10A shows a thickness profile of a masking layer formed on a wafer, FIG. 10B shows a thickness profile of a masking layer formed on a wafer, according to some embodiments of present disclosure. In some embodiments, if it has been determined that the wafer 1 should be divided into three or more regions (as discussed in FIG. 3A to FIG. 3C and FIG. 4 to FIG. 7), one or more third arm 411 can be incorporated into the apparatus 3. By incorporating the third arm 411, the thickness profile of the masking layer 11 may have three or more observable different thicknesses of the thickness profile, wherein a thickness of the masking layer 11 is thicker in the inner region than in an intermediate region, while a thickness of the masking layer 11 is thicker in the intermediate region than in the outer region. In some embodiments, if one or more of the second arm 401 and the third arm 411 is moving while dispensing the second liquid 409, the thickness profile of the masking layer 11 may have a sloped thickness profile, similar to the thickness profile of the masking layer 11 discussed in FIG. 8D.

Figure 12:
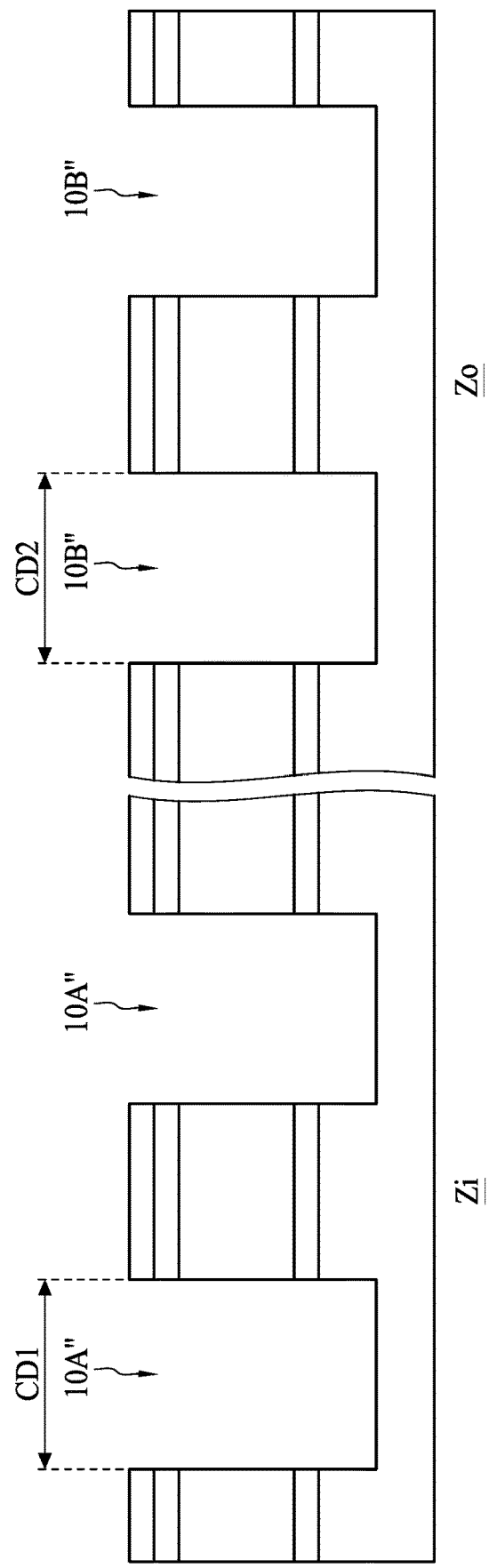
FIG. 12 is a schematic drawing illustrating a cross sectional view of a plurality of trenches formed in a wafer, in accordance with some comparative embodiments of the present disclosure.

Referring to FIG. 11 and FIG. 12, FIG. 11 is a schematic drawing illustrating an apparatus for performing an etching operation on a wafer, FIG. 12 is a schematic drawing illustrating a cross sectional view of a plurality of trenches formed in a wafer, in accordance with some comparative embodiments of the present disclosure. After the first liquid 309 is solidified and thereby forms the masking layer 11, a dry etch operation (such as plasma etching operation) is performed to utilize ions 211 to remove a portion of the wafer 1 (including material of layers or film formed thereon) exposed by the masking layer 11. By performing dry etch operation, such as plasma etching operation, a plurality of trenches 10A" and 10B" are formed in the wafer 1. In some alternative embodiments, a plurality of semiconductor lines is formed in the wafer 1. In some alternative embodiments, a plurality of grating structures is formed in the wafer 1. In some alternative embodiments, a plurality of fins is formed in the wafer 1.

As previously discussed, a thickness of the masking layer 11 in each region is adjusted according to compensate non-uniform distribution of plasma etch rate across the wafer 1. Therefore, when a masking layer 11 at an outer region Zo has a thickness less than a thickness of the masking layer 11 at an inner region Zi, the plasma etching duration at the outer region Zo is relatively longer than the duration at the inner region Zi. Thus a distribution of trenches formed in the wafer 1 has a more uniformed distribution across the wafer 1. Alternatively stated, a difference between a critical dimension CD1 of trenches 10A formed in the inner region Zi and a critical dimension CD2 of trenches 10B formed in the inner region Zo are relatively less comparing to the comparative embodiment discussed in FIG. 1C. In some alternative embodiments, a difference between a depth of trenches 10A in the inner region Zi and a depth of trenches 10B in the outer region Zo may be decreased comparing to the comparative embodiment discussed in FIG. 1C.

The present disclosure provides a method for forming a masking layer and a method for forming a photoresist layer. The present disclosure also provides an apparatus for forming a photoresist layer or masking layer. By adjusting a thickness profile of a masking layer or a photoresist layer, the uniformity of the plasma etch in an inner region and outer region can be improved. Specifically, by dispensing the second liquid 409 at a second location for an interval during dispensing the first liquid 309, a portion of the first liquid 309 in a region can be partially remove, thus the masking layer 11 formed by first liquid 309 may have different thicknesses across the wafer 1. Due to the phenomena of non-uniformity of plasma etch rate across the wafer 1, the thinner portion of the masking layer 11 is configured to be in a region where the local plasma etch rate is lower; while the thicker portion of the masking layer 11 is configured to be in a region where the local plasma etch rate is greater. Thereby the non-uniformity of plasma etch rate across the wafer 1 can be compensated. For example, since the local plasma etch rate may be lower at an outer region, the masking layer 11 formed on the wafer 1 has a thinner thickness at the outer region.

Furthermore, several techniques can be used to control the thickness profile of the masking layer 11. In some embodiments, prior to dispensing the first liquid 309 and the second liquid 409, the wafer 1 can be divided into a plurality of regions according to the size of the wafer, a non-uniformity profile of plasma etch rate across the wafer 1, a critical dimension distribution of trenches to be formed across the wafer 1, or by customized predetermined setting. Herein calibration wafer(s) 1c can be utilized as a trial experimental sample or may serve as assessment basis to facilitate the efficiency of determining the thickness profile of the to-be-formed masking layer 11. Other factors contributes to the thickness profile of the masking layer 11 may include the location of dispensing the second liquid 409, the dispensing duration of the first liquid 309 and the second liquid 409, whether incorporating one or more third arm 411 to dispense the second liquid 409 at a different location, and whether the second arm 401 or the third arm 411 is fixed or moving during dispensing the second liquid 409.

The techniques and features disclosed in the present disclosure may be applied to several technical fields, such as photoresist coating, integrated circuit lithography operation, liquid crystal display operation, memory device fabrication. The techniques and features disclosed in the present disclosure may be applied to several technology nodes, such as N65, N40, N28, N22, N16, N10, N7, N5, or the like.

Some embodiments of the present disclosure provide a method for forming a masking layer, including spinning a wafer, dispensing a first liquid at a first location on the wafer, and dispensing a second liquid at a second location on the wafer simultaneously with dispensing the first liquid at the first location, wherein the second liquid is a remover of the first liquid, and the first location is different from the second location.

Some embodiments of the present disclosure provide a method for forming a photoresist layer, including dispensing photoresist at a first location of a wafer, dispensing solvent at a second location of the wafer, the solvent being configured to remove the photoresist, and terminating the dispensing of the solvent, thereby a thickness of the photoresist layer from the second location to an edge of the wafer is thinner than a thickness of the photoresist layer from the first location to the second location of the wafer.

Some embodiments of the present disclosure provide an apparatus for forming a photoresist layer, including a first arm for dispensing a photoresist, wherein a first nozzle of the first arm is configured to align with a first location of an underlying wafer spinner, and a second arm for dispensing a first solvent, wherein a second nozzle of the second arm is configured to align with a second location of the underlying wafer spinner, wherein the first location is closer to a center of the underlying wafer spinner than the second location.

The foregoing outlines features of several embodiments so that those skilled in the art may better understand the aspects of the present disclosure. Those skilled in the art should appreciate that they may readily use the present disclosure as a basis for designing or modifying other operations and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed:

1. A method for coating a material over a wafer, comprising:
    forming a masking layer with a non-uniform thickness profile over a wafer, comprising:
        spinning the wafer;
        dispensing a first liquid at a first location on the wafer; and
        dispensing a second liquid at a second location on the wafer simultaneously with dispensing the first liquid at the first location, wherein the second liquid is a remover of the masking layer, and the first location is different from the second location, thereby a thickness of the masking layer at a position between the second location and an edge of the wafer is thinner than a thickness of the masking layer at a position between the first location and the second location of the wafer.

2. The method of claim 1, further comprising dispensing the first liquid only at the first location after simultaneously dispensing the second liquid and the first liquid.

3. The method of claim 1, wherein the first location is over a center of the wafer.

4. The method of claim 3, wherein the second location is between an edge of the wafer and the first location.

5. The method of claim 1, further comprising altering the second location prior to dispensing the second liquid and the first liquid.

6. The method of claim 5, wherein altering the second location comprises moving a second dispensing mechanism for dispensing the second liquid along a primary axis of a first dispensing mechanism for dispensing the first liquid.

7. The method of claim 1, further comprising altering the second location while dispensing the second liquid and the first liquid.

8. A method for forming a photoresist layer with a non-uniform thickness profile, comprising:
    applying photoresist at a first location of a wafer;
    dispensing solvent at a second location of the wafer during the application of photoresist at the first location, wherein the solvent is configured to remove the photoresist; and
    terminating the dispensing of the solvent, thereby a thickness of the photoresist layer from the second location to an edge of the wafer is thinner than a thickness of the photoresist layer from the first location to the second location of the wafer.

9. The method of claim 8, wherein the first location is at a center of the wafer, and the second location is between the first location and the edge of the wafer.

10. The method of claim 8, further comprising determining the second location based on a critical dimension to be formed on wafer.

11. The method of claim 8, further comprising dispensing the photoresist after terminating the dispensing of the solvent.

12. The method of claim 8, further comprising dispensing the solvent at a third location of the wafer simultaneously with dispensing the solvent at the second location of the wafer.

13. The method of claim 8, wherein the second location is fixed during dispensing the photoresist on the wafer.

14. The method of claim 8, wherein the second location is moving during dispensing the photoresist on the wafer.

15. A method for forming a photoresist layer over a wafer, comprising:
    forming a photoresist layer with a non-uniform thickness profile over a wafer, comprising:
        rotating the wafer;
        applying photoresist at a first location of the wafer by a first arm during the wafer being rotated;

moving a nozzle of a second arm for dispensing solvent to a second location different from the first location, wherein the solvent is configured to partially remove the photoresist;

initiating the dispensing of solvent at the second location of the wafer during the application of the photoresist;

moving the nozzle of the second arm along a first direction to a third location while dispensing the solvent simultaneously; and terminating the dispensing of the solvent after the nozzle is moved to the third location, thereby a thickness of the photoresist layer at a position between the second location and the third location of the wafer is thinner than a thickness of the photoresist layer at a position between the first location and the second location of the wafer.

16. The method of claim 15, wherein the dispensing of the photoresist is continued for a period of time subsequent to the termination of the solvent.

17. The method of claim 15, wherein a distance between a center of the wafer and the second location is less than a distance between the center of the wafer and the third location.

18. The method of claim 15, wherein the first direction is parallel to the first arm.

19. The method of claim 15, further comprising dispensing the solvent at a fourth location different from the second location by a third arm.

20. The method of claim 15, wherein the dispensing of the photoresist is terminated after the dispensing of the solvent is terminated, and the photoresist has a sloped profile after the termination of the dispensing of the photoresist.

* * * * *